(12) United States Patent
Baek et al.

(10) Patent No.: US 12,156,458 B2
(45) Date of Patent: Nov. 26, 2024

(54) DISPLAY DEVICE

(71) Applicant: Samsung Display Co., Ltd., Yongin-si (KR)

(72) Inventors: Gyungmin Baek, Yongin-si (KR); Hyuneok Shin, Gwacheon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 432 days.

(21) Appl. No.: 17/455,199

(22) Filed: Nov. 16, 2021

(65) Prior Publication Data
US 2022/0302220 A1 Sep. 22, 2022

(30) Foreign Application Priority Data
Mar. 16, 2021 (KR) .................. 10-2021-0034226

(51) Int. Cl.
*H10K 59/80* (2023.01)
*H10K 50/844* (2023.01)
(Continued)

(52) U.S. Cl.
CPC ..... *H10K 59/80517* (2023.02); *H10K 50/844* (2023.02); *H10K 50/856* (2023.02); *H10K 50/858* (2023.02); *H10K 59/131* (2023.02); *H10K 59/353* (2023.02); *H10K 59/124* (2023.02); *H10K 59/8731* (2023.02); *H10K 2102/103* (2023.02)

(58) Field of Classification Search
None
See application file for complete search history.

(56) References Cited

U.S. PATENT DOCUMENTS 10,886,326 B2 * 1/2021 Bang .................. H10K 59/124
2015/0228700 A1 * 8/2015 Cho .................... H10K 59/878
257/40
(Continued)

FOREIGN PATENT DOCUMENTS

CN         111063719 A    4/2020
KR    10-2012-0061396 A   6/2012
(Continued)

*Primary Examiner* — Scott B Geyer
(74) *Attorney, Agent, or Firm* — Lewis Roca Rothgerber Christie LLP

(57) ABSTRACT

A display device includes a substrate including a module-corresponding area including a sub-pixel area, and a transparent area, a display area surrounding a part of the module-corresponding area and including a sub-pixel area, and a pixel circuit area at one side of the display area, a signal wire in the module-corresponding area, and extending from the module-corresponding area to the pixel circuit area, an insulating layer on the signal wire, a lower electrode connected to the signal wire through a contact hole in the insulating layer, the lower electrode including a low reflection layer in the sub-pixel area, and on the insulating layer, a high refraction layer on the low reflection layer, a first metal layer on the high refraction layer, and a second metal layer on the first metal layer, a light emitting layer on the lower electrode, an upper electrode on the light emitting layer, and a functional module in the module-corresponding area on a bottom surface of the substrate.

32 Claims, 22 Drawing Sheets

(51) Int. Cl.
*H10K 50/856* (2023.01)
*H10K 50/858* (2023.01)
*H10K 59/124* (2023.01)
*H10K 59/131* (2023.01)
*H10K 59/35* (2023.01)
*H10K 102/10* (2023.01)

(56) References Cited

U.S. PATENT DOCUMENTS

| | | | |
|---|---|---|---|
| 2016/0351651 A1* | 12/2016 | Jang | H10K 59/80518 |
| 2017/0278910 A1* | 9/2017 | Choi | H10K 59/122 |
| 2017/0279084 A1* | 9/2017 | Sakamoto | H10K 50/828 |
| 2018/0040851 A1* | 2/2018 | Sasaki | H10K 50/846 |
| 2019/0157606 A1* | 5/2019 | Odaka | H10K 71/621 |
| 2019/0288043 A1* | 9/2019 | Shin | H10K 50/813 |
| 2021/0193954 A1* | 6/2021 | Shin | H10K 59/80522 |
| 2021/0359274 A1* | 11/2021 | Kim | H10K 59/8731 |

FOREIGN PATENT DOCUMENTS

| | | |
|---|---|---|
| KR | 10-2016-0008681 A | 1/2016 |
| KR | 10-2017-0113066 A | 10/2017 |
| KR | 10-2023546 B1 | 9/2019 |

* cited by examiner

DISPLAY DEVICE

CROSS-REFERENCE TO RELATED APPLICATION

This application claims priority to and the benefit of Korean Patent Application No. 10-2021-0034226 filed on Mar. 16, 2021 in the Korean Intellectual Property Office (KIPO), the entire disclosure of which is incorporated herein by reference.

BACKGROUND

1. Field

Embodiments of the present disclosure relate generally to a display device including a functional module.

2. Description of the Related Art

Flat panel display devices are used as display devices and replace cathode ray tube display devices due to their light-weight and thin characteristics. Representative examples of such flat panel display devices include a liquid crystal display device and an organic light emitting diode display device.

The display device may include a module-corresponding area in which a functional module (e.g., a camera module) is located, and a display area surrounding the module-corresponding area and in which light emitting structures are arranged. In this case, the functional module may be located on a bottom surface of a lower substrate included in the display device.

Recently, a display device in which a light emitting structure is also located in the module-corresponding area to display an image has been developed. In this case, after a part of a light collected by the functional module through the module-corresponding area is reflected from a top surface of the functional module, the light may be reflected from the light emitting structure (e.g., a bottom surface of an anode electrode) located in the module-corresponding area, and the reflected light may be incident onto the functional module again. However, light interference may occur so an image acquired from the functional module may be distorted.

SUMMARY

Embodiments of the present disclosure describe a display device including a functional module.

According to embodiments of the present disclosure, a display device may include a substrate including a module-corresponding area including a sub-pixel area for the module-corresponding area, and a transparent area, a display area surrounding at least a part of the module-corresponding area and including a sub-pixel area, and a pixel circuit area for the module-corresponding area at one side of the display area, a signal wire in the module-corresponding area on the substrate, and extending from the module-corresponding area to the pixel circuit area for the module-corresponding area, an insulating layer on the signal wire, a lower electrode connected to the signal wire through a contact hole in the insulating layer, the lower electrode including a low reflection layer in the sub-pixel area for module-corresponding area, and on the insulating layer, a high refraction layer on the low reflection layer, a first metal layer on the high refraction layer, and a second metal layer on the first metal layer, a light emitting layer on the lower electrode, an upper electrode on the light emitting layer, and a functional module in the module-corresponding area on a bottom surface of the substrate.

The display device may further include a light emitting structure in the sub-pixel area, and on the substrate.

The display device may further include a pixel circuit structure in the sub-pixel area, and between the substrate and the light emitting structure, the pixel circuit structure including a semiconductor element.

The pixel circuit structure might not overlap the functional module.

The display device may further include a planarization layer between the semiconductor element in the sub-pixel area and the insulating layer, wherein the planarization layer extends from the sub-pixel area to the module-corresponding area.

The display device may further include a connection electrode in the sub-pixel area on the planarization layer, wherein the pixel circuit structure is electrically connected to the light emitting structure.

The light emitting structure may be connected to the connection electrode through the contact hole in the insulating layer, wherein the connection electrode is connected to the semiconductor element in the sub-pixel area through a contact hole in the planarization layer.

The connection electrode and the signal wire may be on a same layer.

A thickness of the signal wire may be less than a thickness of the connection electrode.

The lower electrode, the light emitting layer, and the upper electrode may define a light emitting structure for the module-corresponding area.

The display device may further include a pixel circuit structure for the module-corresponding area in the pixel circuit area for the module-corresponding area, and on the substrate, the pixel circuit structure including a semiconductor element.

The signal wire may be configured to electrically connect the light emitting structure for the module-corresponding area to the pixel circuit structure for the module-corresponding area.

The pixel circuit structure for the module-corresponding area might not overlap the functional module.

The high refraction layer may include a transparent conductive material.

The high refraction layer may include indium tin zinc oxide (ITZO) or indium zinc oxide (IZO).

A thickness of the high refraction layer may be less than or equal to about 55 nanometers.

A refractive index of the high refraction layer may be greater than or equal to about 1.9.

The low reflection layer may include a transparent conductive material.

The transparent conductive material may include at least one selected from molybdenum (Mo), titanium (Ti), zirconium (Zr), hafnium (Hf), vanadium (V), niobium (Nb), tantalum (Ta), chromium (Cr), and tungsten (W).

A thickness of the low reflection layer may be less than or equal to about 50 nanometers.

The signal wire may include conductive metal oxide and a transparent conductive material.

A thickness of the first metal layer may be thicker than a thickness of each of the low reflection layer, the high refraction layer, and the second metal layer.

The first metal layer may include silver (Ag), aluminum (Al), gold (Au), copper (Cu), palladium (Pd), platinum (Pt), or rubidium (Rb).

The second metal layer may include indium tin oxide (ITO).

The display device may further include a third metal layer between the first metal layer and the high refraction layer.

The third metal layer may include indium tin oxide (ITO).

The display device may further include a gate insulating layer between the substrate and the insulating layer, and an interlayer insulating layer on the gate insulating layer.

The gate insulating layer and the interlayer insulating layer may be in the display area and do not overlap the functional module in the module-corresponding area.

An outside light incident through the transparent area may pass through the substrate and may collect at the functional module.

According to other embodiments of the present disclosure, a display device may include a display panel including a substrate including a module-corresponding area including a sub-pixel area for the module-corresponding area, and a transparent area, a display area surrounding at least a part of the module-corresponding area and including a sub-pixel area, and a pixel circuit area for the module-corresponding area at one side of the display area, a signal wire in the module-corresponding area on the substrate, and extending from the module-corresponding area to the pixel circuit area for the module-corresponding area, an insulating layer on the signal wire, a lower electrode connected to the signal wire through a contact hole in the insulating layer, the lower electrode including a low reflection layer in the sub-pixel area for module-corresponding area, and on the insulating layer, a high refraction layer on the low reflection layer, a first metal layer on the high refraction layer, and a second metal layer on the first metal layer a light emitting layer on the lower electrode, and an upper electrode on the light emitting layer, a frame on a bottom surface of the display panel, and a functional module in the module-corresponding area between the display panel and the frame, fixed to the frame, and spaced apart from the bottom surface of the display panel.

The display device may further include an air layer between the display panel and the functional module.

The display device may further include an adhesive layer interposed between the display panel and the functional module.

Because the display device according to various embodiments may include the low reflection layer, a part of the light reflected from the top surface of the functional module may be absorbed. In addition, because the display device may include the low reflection layer and the high refraction layer, the first light reflected from the bottom surface of the low reflection layer and the second light passing through the low reflection layer and reflected from the bottom surface of the high refraction layer may be destroyed due to the destructive interference. Accordingly, light interference may not occur so that the image acquired from the functional module is not distorted.

BRIEF DESCRIPTION OF THE DRAWINGS

Embodiments of the present disclosure can be understood in more detail from the following description taken in conjunction with the accompanying drawings.

DETAILED DESCRIPTION

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure may not be described.

Figure 1:
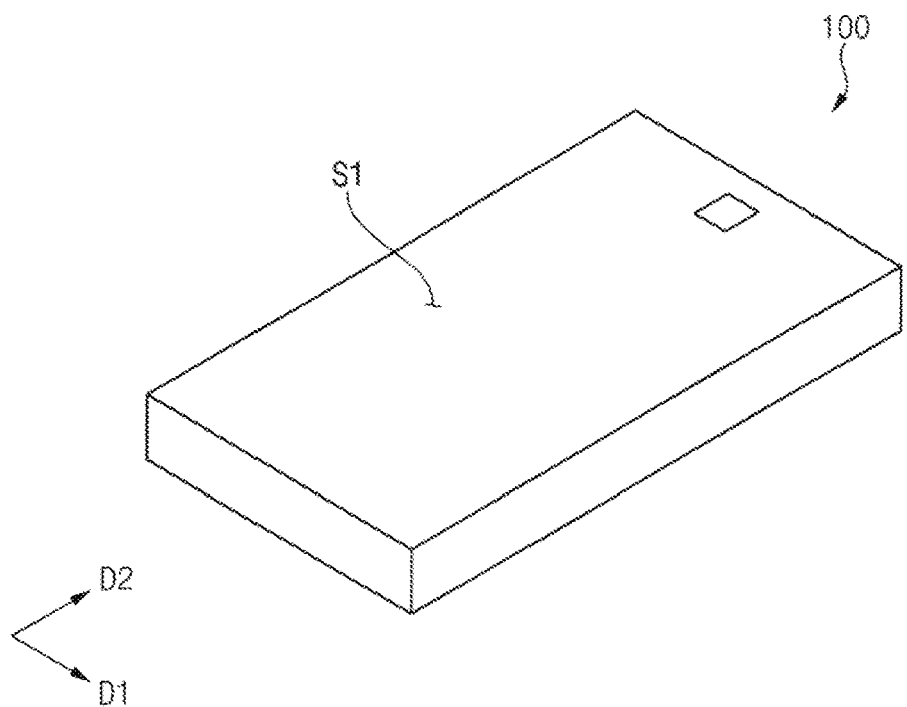
FIGS. 1 and 2 are perspective views showing a display device, according to embodiments of the present disclosure.
Figure 2:
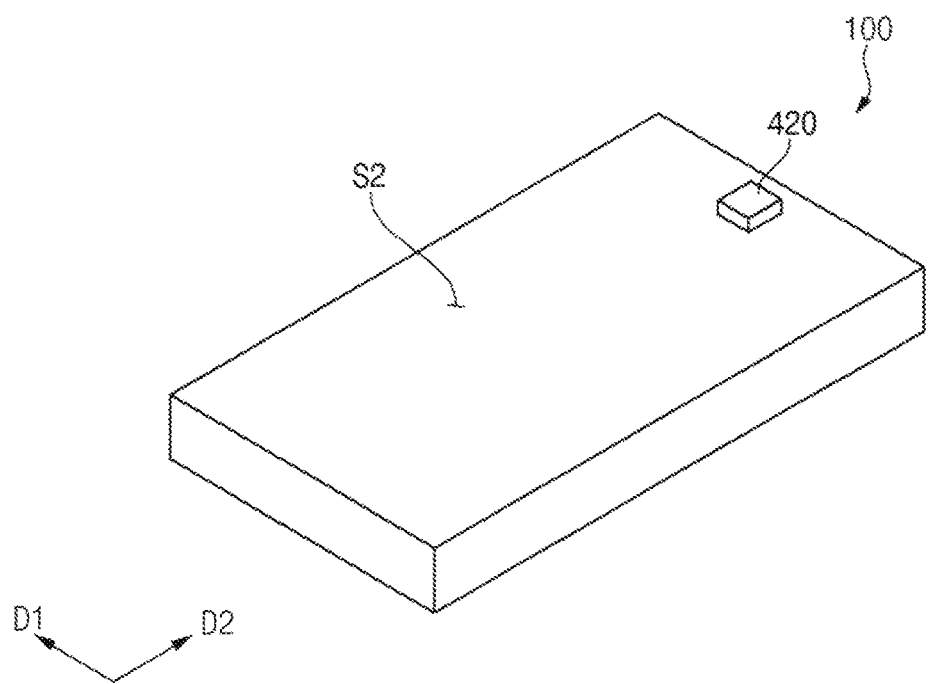
Figure 3:
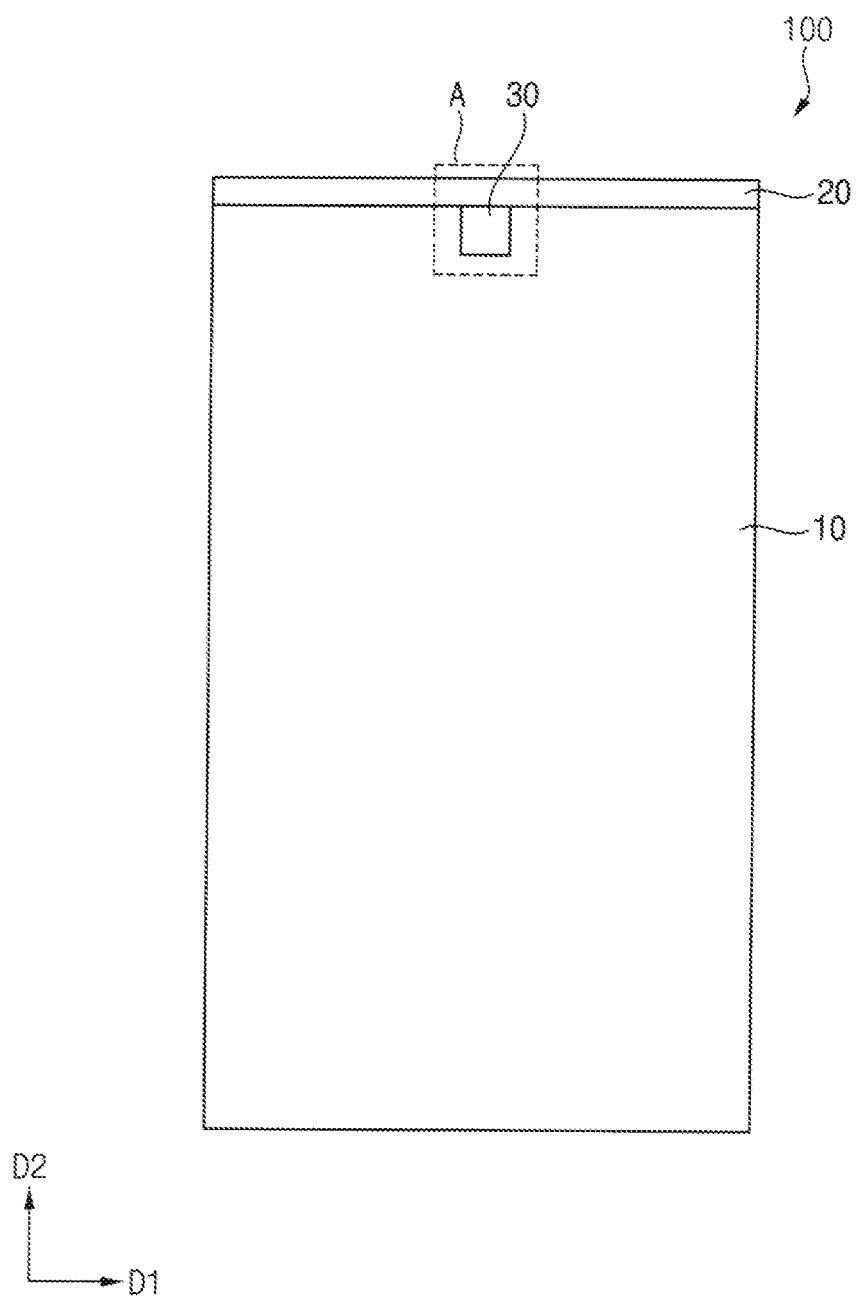
FIG. 3 is a plan view showing a display area, a module-corresponding area, and a circuit area included in the display device of FIG. 1.

FIGS. 1 and 2 are perspective views showing a display device according to various embodiments of the present disclosure, and FIG. 3 is a plan view showing a display area, a module-corresponding area, and a circuit area included in the display device of FIG. 1.

Referring to FIGS. 1, 2, and 3, a display device 100 may include a display area 10, a module-corresponding area 30 (e.g., an area corresponding to an electronic module, or a camera-corresponding area), and a pixel circuit area 20 for the module-corresponding area 30. In some embodiments, the display area 10 may at least partially surround the module-corresponding area 30, and the pixel circuit area 20 for the module-corresponding area 30 may be located on one side of the display area 10. In addition, the pixel circuit area 20 for the module-corresponding area 30 may be adjacent to one side of the module-corresponding area 30. In other words, first to third sides of the module-corresponding area 30 may be surrounded by the display area 10, and a fourth side of the module-corresponding area 30 may be surrounded by the pixel circuit area 20 for the module-corresponding area. In other words, the module-corresponding area 30 may have a rectangular shape when viewed in a plan view.

The display device 100 may include a functional module 420, and may be divided into a first surface S1 and a second surface S2. The first surface S1 may correspond to a surface on which an image is displayed, and the second surface S2 may correspond to a surface on which an image is not displayed. The functional module 420 may overlap the module-corresponding area 30 on the second surface S2. In other words, a shape of the functional module 420 may correspond to the module-corresponding area 30. In some embodiments, an image may be displayed on both a portion of the first surface S1 overlapping the module-corresponding area 30 and a portion of the first surface S1 overlapping the display area 10.

However, although each of the display area 10, the pixel circuit area 20 for the module-corresponding area 30, and the module-corresponding area 30 has been shown as having a rectangular shape, the shape of each of the display area 10, the pixel circuit area 20 for the module-corresponding area 30, and the module-corresponding area 30 is not limited thereto. For example, each of the display area 10, the pixel circuit area 20 for the module-corresponding area 30, and the module-corresponding area 30 may have a triangular shape, a rhombic shape, a polygonal shape, a track shape, a circular shape, or an elliptical shape when viewed in a plan view.

The functional module 420 may include one or more of the following: a camera module for capturing (or recognizing) an image of an object located over the first surface S1 of the display device 100; a face recognition sensor module configured to detect a face of a user; a pupil recognition sensor module configured to detect a pupil of the user; an acceleration sensor module (e.g., an accelerometer) and/or a geomagnetic sensor module configured to determine a movement of the display device 100; a proximity sensor module and/or an infrared sensor module configured to detect proximity with respect to a front side of the display device 100; an illuminance sensor module configured to measure a degree of brightness when left in a pocket or a bag; and the like. In some embodiments, the functional module 420 may be a camera module. For example, the functional module 420 may capture an image by collecting an external light incident onto the first surface S1 overlapping the module-corresponding area 30.

Although the functional module 420 is shown in FIG. 2 as having a rectangular shape when viewed in a plan view, the shape of the functional module 420 is not limited thereto when viewed in a plan view. For example, the functional module 420 may have a triangular shape, a rhombic shape, a polygonal shape, a track shape, a circular shape, or an elliptical shape when viewed in a plan view. In some embodiments, when the shape of the functional module 420 is changed, the shape of the module-corresponding area 30 is also changed according to a shape of an outer periphery of the functional module 420.

Figure 4:
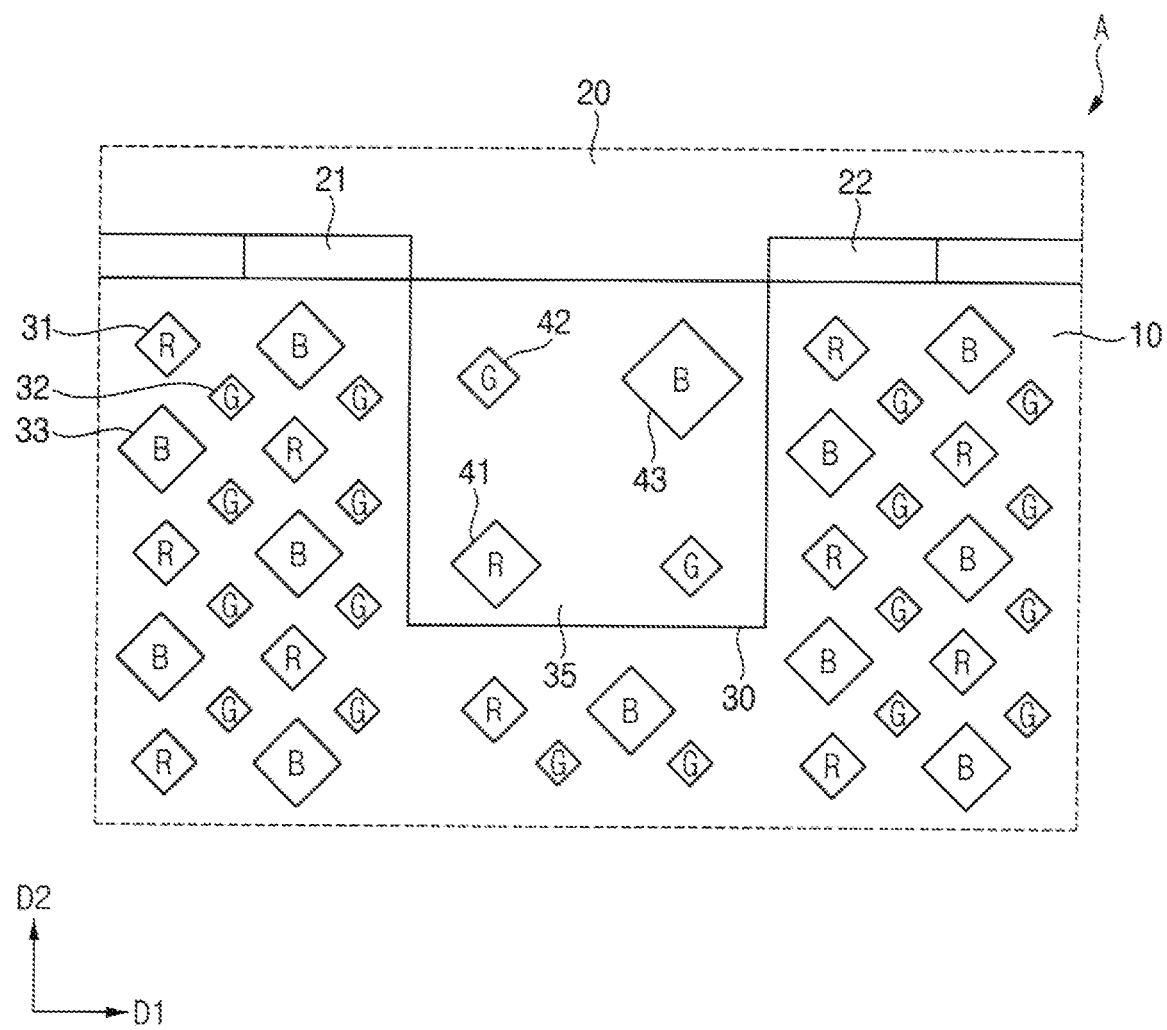
FIGS. 4 and 5 are partially enlarged plan views showing a region A of FIG. 3.
Figure 5:
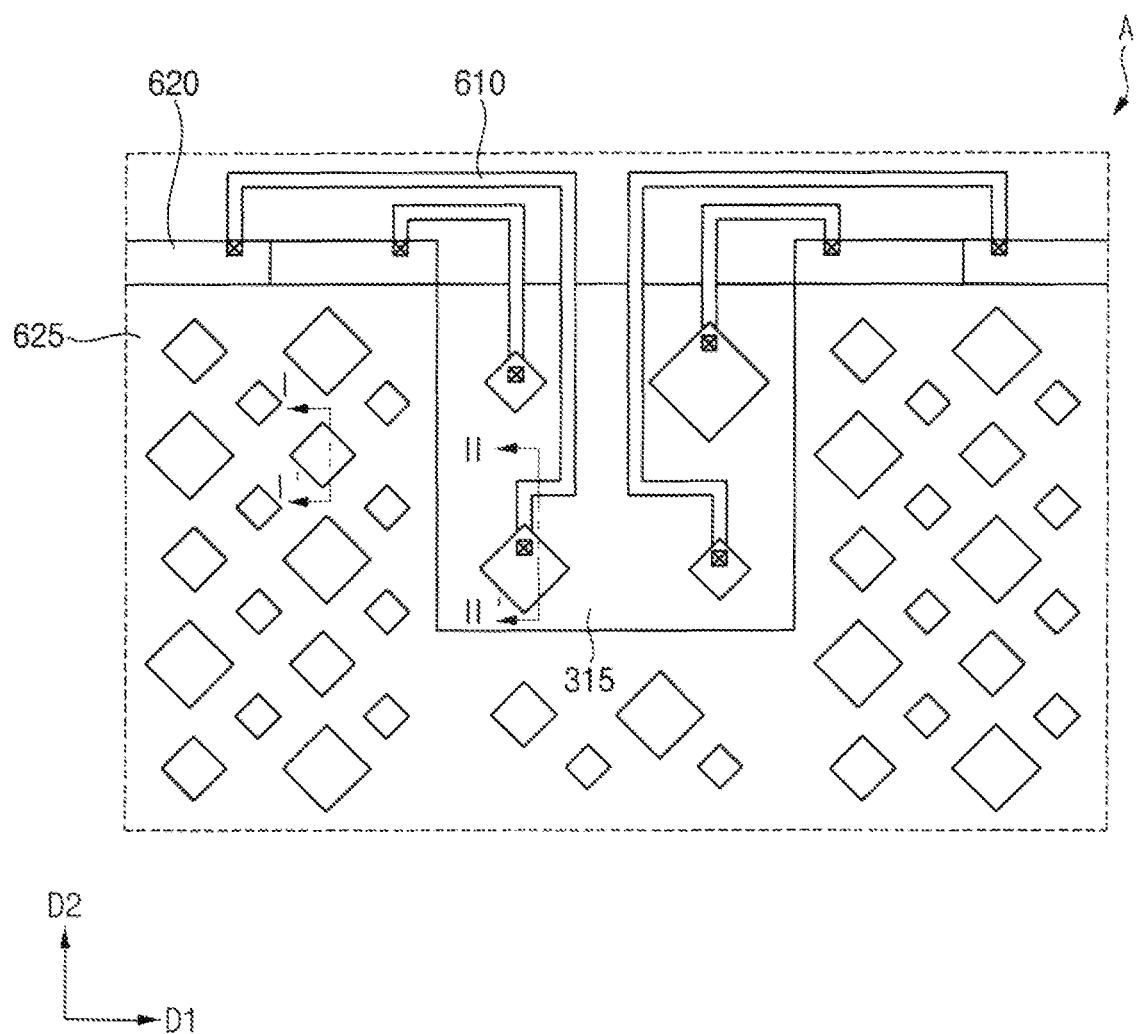

FIGS. 4 and 5 are partially enlarged plan views showing a region A of FIG. 3.

Referring to FIG. 4, the display area 10 may include a first sub-pixel area 31, a second sub-pixel area 32, and a third sub-pixel area 33, and the module-corresponding area 30 may include a first sub-pixel area 41 for the module-corresponding area 30, a second sub-pixel area 42 for the module-corresponding area 30, a third sub-pixel area 43 for the module-corresponding area 30, and a transparent area 35. In addition, the pixel circuit area 20 for the module-corresponding area 30 may include first pixel circuit areas 21 for the module-corresponding area 30, and second pixel circuit areas 22 for the module-corresponding area 30.

The first to third sub-pixel areas 31, 32, and 33 may be repeatedly arranged in the display area 10. For example, the first sub-pixel area 31 and the third sub-pixel area 33 may be repeatedly arranged (e.g., in an alternating pattern) in a first row of the display area 10 (e.g., corresponding to a first direction D1), and the second sub-pixel area 32 may be repeatedly arranged in a second row of the display area 10. In addition, the third sub-pixel area 33 and the first sub-pixel area 31 may be repeatedly arranged (e.g., in an alternating pattern) in a third row of the display area 10, and the second sub-pixel area 32 may be repeatedly arranged in a fourth row of the display area 10. Meanwhile, the first sub-pixel area 31 and the third sub-pixel area 33 may be repeatedly arranged (e.g., in an alternating pattern) in a first column of the display area 10 (e.g., corresponding to a second direction D2), and the second sub-pixel area 32 may be repeatedly arranged in a second column of the display area 10. In addition, the third sub-pixel area 33 and the first sub-pixel area 31 may be repeatedly arranged (e.g., in an alternating pattern) in a third column of the display area 10, and the second sub-pixel area 32 may be repeatedly arranged in a fourth column of the display area 10.

For example, a first light emitting structure R (e.g., a light emitting structure 200 of FIG. 6) configured to emit a red light may be in the first sub-pixel area 31, a second light emitting structure G configured to emit a green light may be in the second sub-pixel area 32, and a third light emitting structure B configured to emit a blue light may be in the third sub-pixel area 33. In other words, red/green-blue/green (RG-BG) light emitting structures may be repeatedly arranged in the display area 10 (e.g., in a PENTILE™ matrix structure, a PENTILE™ structure, or an RGBG structure). PENTILE™ is a registered trademark of Samsung Display Co., Ltd., Republic of Korea.

The second sub-pixel area 42 for the module-corresponding area 30 and the third sub-pixel area 43 for the module-corresponding area 30 may be arranged in a first row of the module-corresponding area 30, and the first sub-pixel area 41 for the module-corresponding area 30 and the second sub-pixel area 42 for the module-corresponding area 30 may be arranged in a second row in the module-corresponding area 30. Meanwhile, the second sub-pixel area 42 for the module-corresponding area 30 and the first sub-pixel area 41 for the module-corresponding area 30 may be arranged in a first column of the module-corresponding area 30, and the third sub-pixel area 43 for the module-corresponding area 30 and the second sub-pixel area 42 for the module-corresponding area 30 may be arranged in a second column of the module-corresponding area 30.

Figure 6:
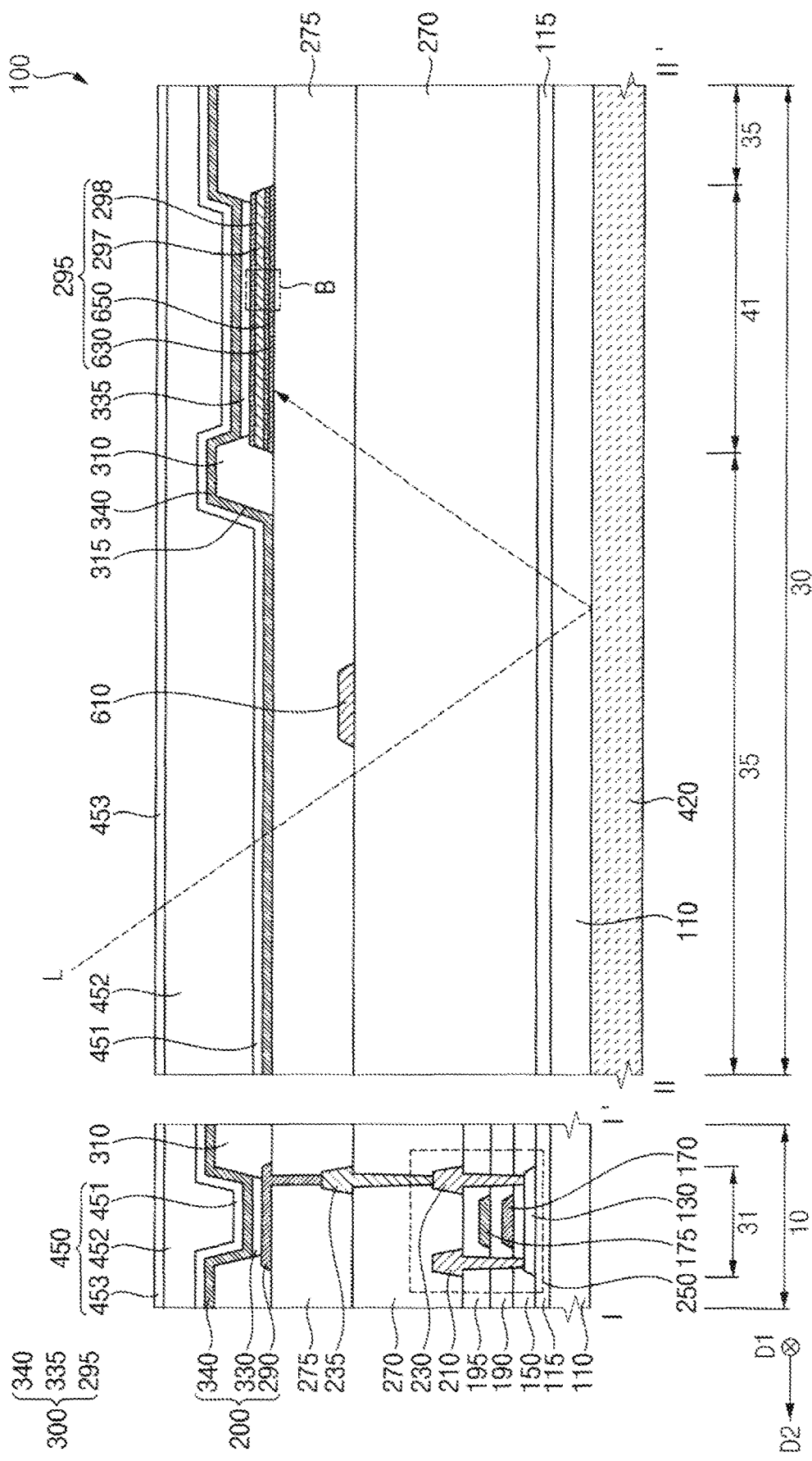
FIG. 6 is a cross-sectional view taken along the line I-I' and the line II-II' of FIG. 5.

For example, a first light emitting structure R for the module-corresponding area 30, which is configured to emit a red light, (e.g., a light emitting structure 300 for a module-corresponding area of FIG. 6) may be in the first sub-pixel area 41 for the module-corresponding area 30, a second light emitting structure G for the module-corresponding area 30, which is configured to emit a green light, may be in the second sub-pixel area 42 for the module-corresponding area 30, and a third light emitting structure B for the module-corresponding area 30, which is configured to emit a blue light, may be disposed in the third sub-pixel area 43 for the module-corresponding area 30. In other words, red/green-blue/green (RG-BG) light emitting structures for the module-corresponding area 30 may be repeatedly arranged in the module-corresponding area 30 (e.g., in a PENTILE™ scheme). PENTILE™ is a registered trademark of Samsung Display Co., Ltd., Republic of Korea.

although only four sub-pixel areas for the module-corresponding area have been shown in the module-corresponding area 30 of FIG. 4, the configuration of the present disclosure is not limited thereto. For example, a plurality of first to third sub-pixel areas 41, 42, and 43 for the module-corresponding area 30 may be arranged in the module-corresponding area 30 in the above-described arrangement scheme.

The remaining portion of the module-corresponding area 30 (e.g., the areas of the module-corresponding area 30 except for the first to third sub-pixel areas 41, 42, and 43 for the module-corresponding area 30) may be defined as the transparent area 35. In some embodiments, sizes of the first to third sub-pixel areas 41, 42, and 43 for the module-corresponding area 30 may be relatively greater than sizes of the first to third sub-pixel areas 31, 32, and 33, respectively. In other words, sizes of the light emitting structures R, G, and B for the module-corresponding area 30 in the first to third sub-pixel areas 41, 42, and 43 for the module-corresponding area 30 may be greater than sizes of the light emitting structures R, G, and B in the first to third sub-pixel areas 31, 32, and 33, respectively.

Although each of the first to third sub-pixel areas 31, 32, and 33 and the first to third sub-pixel areas 41, 42, and 43 for the module-corresponding area 30 according to the present disclosure has been described as having a rhombic shape when viewed in a plan view, the shape is not limited thereto. For example, each of the first to third sub-pixel areas 31, 32, and 33 and the first to third sub-pixel areas 41, 42, and 43 for the module-corresponding area may have a triangular shape, a rectangular shape, a polygonal shape, a circular shape, a track shape, or an elliptical planar shape when viewed in a plan view.

In addition, although the first to third sub-pixel areas 31, 32, and 33 and the first to third sub-pixel areas 41, 42, and 43 for the module-corresponding area 30 have been shown as having mutually different sizes, the configuration of the present disclosure is not limited thereto. For example, the first to third sub-pixel areas 31, 32, and 33 and the first to third sub-pixel areas 41, 42, and 43 for the module-corresponding area may have the same size.

Moreover, although the first to third sub-pixel areas 31, 32, and 33 and the first to third sub-pixel areas 41, 42, and 43 for the module-corresponding area 30 have been described as being arranged in a RG-BG matrix structure (e.g., PENTILE® scheme, PENTILE™ being a registered trademark of Samsung Display Co., Ltd., Republic of Korea), the configuration of the present disclosure is not limited thereto. For example, the first to third sub-pixel areas 31, 32, and 33 and the first to third sub-pixel areas 41, 42, and 43 for the module-corresponding area 30 may be arranged by using an RGB stripe scheme in which rectangles having the same size are sequentially arranged, an S-stripe scheme including a blue sub-pixel structure having a relatively large area, a WRGB scheme further including a white sub-pixel structure, or the like.

The first pixel circuit areas 21 for the module-corresponding area 30 may be adjacent to a first portion of the display area 10 (e.g., the display area 10 located on a left side of the module-corresponding area 30) in the pixel circuit area 20 for the module-corresponding area 30, and may be arranged in the first direction D1. The second pixel circuit areas 22 for the module-corresponding area may be adjacent to a second portion of the display area 10 (e.g., the display area 10 located on a right side of the module-corresponding area 30) in the pixel circuit area 20 for the module-corresponding area 30, and may be arranged in the first direction D1.

A pixel circuit structure for the module-corresponding area 30 (e.g., a pixel circuit structure 620 for a module-corresponding area 30 of FIG. 5) electrically connected to the light emitting structure for the module-corresponding area 30 may be located in the first and second pixel circuit areas 21 and 22 for the module-corresponding area 30. Meanwhile, a pixel circuit structure (e.g., a pixel circuit structure 625 of FIG. 5) electrically connected to the light emitting structure in the display area 10 may be located in the display area 10. For example, the pixel circuit structure may be located under the light emitting structure, so that the pixel circuit structure and the light emitting structure may overlap each other. Meanwhile, the light emitting structure for the module-corresponding area 30 may be located in the module-corresponding area 30, and the pixel circuit structure for the module-corresponding area 30 may be located in the pixel circuit area 20 for the module-corresponding area 30, so the light emitting structure for the module-corresponding area 30 and the pixel circuit structure for the module-corresponding area 30 may not overlap each other.

Although the first and second pixel circuit areas 21 and 22 for the module-corresponding area 30 have been described as being adjacent to the display area 10 in the pixel circuit area 20 for the module-corresponding area 30, the configuration of the present disclosure is not limited thereto. For example, the first and second pixel circuit areas 21 and 22 for the module-corresponding area 30 may be located in the pixel circuit area 20 for the module-corresponding area and spaced apart from the display area 10.

Referring to FIG. 5, a pixel circuit structure 625 may be located in the display area 10, and may include at least one semiconductor element (e.g., a semiconductor element 250 of FIG. 6), at least one capacitor, and the like, and may drive the light emitting structure (e.g., the light emitting structure 200 of FIG. 6). For example, a pixel circuit structure 625 connected to the first light emitting structure R may be defined as a first pixel circuit structure, a pixel circuit structure 625 connected to the second light emitting structure G may be defined as a second pixel circuit structure, and a pixel circuit structure 625 connected to the third light emitting structure B may be defined as a third pixel circuit structure.

The first pixel circuit structure may overlap the first light emitting structure R under the first light emitting structure R. An area of the first pixel circuit structure may be less than or greater than an area of the first light emitting structure R. In some embodiments, the first pixel circuit structure may concurrently (e.g., simultaneously) overlap a part of the first light emitting structure R and a part of the second light emitting structure G (or the third light emitting structure B) that is adjacent to the first light emitting structure R.

The second pixel circuit structure may overlap the second light emitting structure G under the second light emitting structure G. An area of the second pixel circuit structure may be less than or greater than an area of the second light emitting structure G. In some embodiments, the second pixel circuit structure may concurrently (e.g., simultaneously) overlap a part of the second light emitting structure G and a part of the first light emitting structure R (or the third light emitting structure B) that is adjacent to the second light emitting structure G.

The third pixel circuit structure may overlap the third light emitting structure B under the third light emitting structure B. An area of the third pixel circuit structure may be less than or greater than an area of the third light emitting structure B. In some embodiments, the third pixel circuit structure may concurrently (e.g., simultaneously) overlap a part of the third light emitting structure B and a part of the first light emitting structure R (or the second light emitting structure G) that is adjacent to the third light emitting structure B.

A pixel circuit structure 620 for the module-corresponding area 30 may be located in the first and second pixel circuit areas 21 and 22 for the module-corresponding area 30 of the pixel circuit area 20. The pixel circuit structure 620 for the module-corresponding area 30 may include at least one semiconductor element, at least one capacitor, and the like, and may drive the light emitting structure for the module-corresponding area 30 (e.g., the light emitting structure 300 for the module-corresponding area 30 of FIG. 6). For example, a pixel circuit structure 620 for the module-corresponding area 30, which is connected to the first light emitting structure R for the module-corresponding area, may be defined as a first pixel circuit structure for the module-corresponding area 30. A pixel circuit structure 620 for the module-corresponding area 30, which is connected to the second light emitting structure G for the module-corresponding area 30, may be defined as a second pixel circuit structure for the module-corresponding area 30. A pixel circuit structure 620 for the module-corresponding area 30, which is connected to the third light emitting structure B for the module-corresponding area 30, may be defined as a third pixel circuit structure for the module-corresponding area 30.

The first pixel circuit structure for the module-corresponding area 30 may be located in the first pixel circuit area 21 for the module-corresponding area 30. The first light emitting structure R for the module-corresponding area 30 and the first pixel circuit structure for the module-corresponding area 30 may be electrically connected to each other through a signal wire 610.

The second pixel circuit structure for the module-corresponding area 30 may be located both in the first pixel circuit area 21 for the module-corresponding area 30 and in the second pixel circuit area 22 for the module-corresponding area 30. The second light emitting structure G for the module-corresponding area 30 and the second pixel circuit structure for the module-corresponding area 30 may be electrically connected to each other through a signal wire 610.

The third pixel circuit structure for the module-corresponding area 30 may be located in the second pixel circuit area 22 for the module-corresponding area 30. The third light emitting structure B for the module-corresponding area 30 and the third pixel circuit structure for the module-corresponding area 30 may be electrically connected to each other through a signal wire 610.

A transmission window 315 (e.g., an opening 315 of FIG. 6) may be located in the transparent area 35. In some embodiments, the pixel circuit structure 625 and the pixel circuit structure 620 for the module-corresponding area 30 may not overlap the transmission window 315 (i.e., the transparent area 35). In some embodiments, the functional module 420 may collect a light incident from the outside through the transmission window 315.

Figure 7:
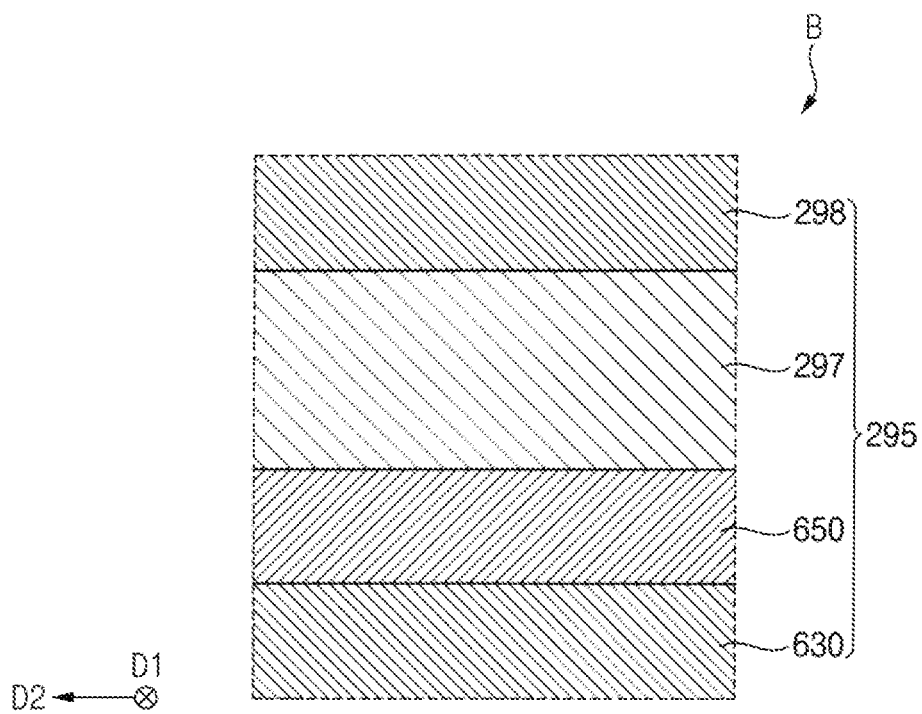
FIG. 7 is a partially enlarged plan view showing a region B of FIG. 6.

FIG. 6 is a cross-sectional view taken along the line I-I' and the line II-II' of FIG. 5. FIG. 7 is a partially enlarged plan view showing a region B of FIG. 6.

Referring to FIGS. 6 and 7, the display device 100 may include a functional module 420, a substrate 110, a buffer layer 115, a gate insulating layer 150, a first interlayer insulating layer 190, a second interlayer insulating layer 195, a semiconductor element 250, a connection electrode 235, a planarization layer 270, an insulating layer 275, a light emitting structure 200, a light emitting structure 300 for the module-corresponding area 30, a pixel defining layer 310, a signal wire 610, a thin film encapsulation layer 450, and the like. In some embodiments, the light emitting structure 300 for the module-corresponding area 30 may include a first lower electrode 295, a first light emitting layer 335, and an upper electrode 340, and the light emitting structure 200 may include a second lower electrode 290, a second light emitting layer 330, and the upper electrode 340. In addition, the semiconductor element 250 may include an active layer 130, a first gate electrode 170, a second gate electrode 175, a source electrode 210, and a drain electrode 230. Further, the thin film encapsulation layer 450 may include a first inorganic thin film encapsulation layer 451, an organic thin film encapsulation layer 452, and a second inorganic thin film encapsulation layer 453. Moreover, the first lower electrode 295 may include a low reflection layer 630, a high refraction layer 650, a first metal layer 297, and a second metal layer 298.

In some embodiments, the substrate 110 including transparent materials may be provided. The substrate 110 may be a transparent resin substrate having flexibility. For example, the substrate 110 may have a configuration in which a first organic layer, a first barrier layer, a second organic layer, and a second barrier layer are sequentially stacked. The first barrier layer and the second barrier layer may include an inorganic material such as silicon oxide, and may block water and/or moisture penetrating through the first and second organic layers. In some embodiments, the first organic layer and the second organic layer may include an organic insulating material such as a polyimide-based resin, and may have flexibility.

In some embodiments, because the display device 100 includes the display area 10, the module-corresponding area 30, and the pixel circuit area 20 for the module-corresponding area 30, the substrate 110 may likewise be divided into a display area 10, a module-corresponding area 30, and a pixel circuit area 20 for the module-corresponding area 30.

In some embodiments, the substrate 110 may include a quartz substrate, a synthetic quartz substrate, a calcium fluoride substrate, a fluorine-doped quartz substrate (F-doped quartz substrate), a soda lime glass substrate, a non-alkali glass substrate, and the like.

Although the substrate 110 has been described as having four layers, the configuration of the substrate 110 is not limited thereto. For example, in some embodiments, the substrate 110 may include a single layer or a plurality of layers.

The functional module 420 may be located in the module-corresponding area 30 on a bottom surface of the substrate 110. For example, the functional module 420 may make direct contact with the bottom surface of the substrate 110. In some embodiments, the functional module 420 may have the same shape as the module-corresponding area 30 when viewed in a plan view. For example, the functional module 420 may have a rectangular shape when viewed in a plan view. When a light is incident onto the display device 100 from the outside and passes through some or all of the thin film encapsulation layer 450, the upper electrode 340, the insulating layer 275, the planarization layer 270, the buffer layer 115, the substrate 110, and the like, the light may be provided to the functional module 420. In some embodiments, the functional module 420 may include a camera module. The camera module may collect the light incident from the outside, and the display device 100 may acquire an image from the camera module.

The buffer layer 115 may be arranged on the substrate 110. For example, the buffer layer 115 may be arranged over the whole display area 10 and the module-corresponding area 30 on the substrate 110. The buffer layer 115 may reduce or prevent metal atoms or impurities diffusing from the substrate 110 to the semiconductor element 250, and may control a heat transfer rate during a crystallization process for forming the active layer 130 to obtain a substantially uniform active layer 130. In some embodiments, when a surface of the substrate 110 is not uniform, the buffer layer 115 may serve to improve flatness of the surface of the substrate 110. Depending on a type of the substrate 110, two or more buffer layers 115 may be provided on the substrate 110, or in some embodiments, the buffer layer 115 may not be provided (e.g., the buffer layer 115 may be omitted). The buffer layer 115 may include a silicon compound, metal oxide, and the like. In other embodiments, the buffer layer 115 may be disposed only in the display area 10 without being in the module-corresponding area 30. In other words, the buffer layer 115 may not overlap the functional module 420.

The active layer 130 may be arranged in the display area 10 (or the first sub-pixel area 31) on the buffer layer 115. The active layer 130 may include a metal oxide semiconductor, an inorganic semiconductor (e.g., amorphous silicon or poly silicon), an organic semiconductor, or the like. The active layer 130 may include a source region, a drain region, and a channel region located between the source region and the drain region.

The gate insulating layer 150 may be arranged on the active layer 130. The gate insulating layer 150 may cover the active layer 130 in the display area 10 on the buffer layer 115, and may not be in the module-corresponding area 30. In other words, the gate insulating layer 150 may not overlap the functional module 420. For example, the gate insulating layer 150 may sufficiently cover the active layer 130 on the buffer layer 115, and may have a substantially flat top surface without creating a step around the active layer 130. In some embodiments, the gate insulating layer 150 may be arranged along a profile of the active layer 130 with a uniform thickness that covers the active layer 130 on the buffer layer 115. The gate insulating layer 150 may include a silicon compound, metal oxide, and the like. For example, the gate insulating layer 150 may include silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), and the like. In other embodiments, the gate insulating layer 150 may have a multilayer structure including a plurality of insulating layers. The insulating layers may include mutually different materials, and may have mutually different thicknesses.

In some embodiments, the first gate electrode 170 may be in the display area 10 on the gate insulating layer 150. The first gate electrode 170 may be arranged on a portion of the gate insulating layer 150 under which the active layer 130 is located (e.g., to overlap the channel region of the active layer 130). The first gate electrode 170 may include a metal, an alloy, metal nitride, conductive metal oxide, a transparent conductive material, and the like. For example, the first gate electrode 170 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), an aluminum-containing alloy, aluminum nitride ($AlN_x$), a silver-containing alloy, tungsten nitride ($WN_x$), a copper-containing alloy, a molybdenum-containing alloy, titanium nitride ($TiN_x$), chromium nitride ($CrN_x$), tantalum nitride ($TaN_x$), strontium ruthenium oxide ($SrRu_xO_y$), zinc oxide ($ZnO_x$), indium tin oxide (ITO), tin oxide ($SnO_x$), indium oxide ($InO_x$), gallium oxide ($GaO_x$), indium zinc oxide (IZO), and the like. These elements may be used alone or in combination with each other. In other embodiments, the first gate electrode 170 may have a multilayer structure including a plurality of metal layers. The metal layers may include mutually different materials, and may have mutually different thicknesses.

In some embodiments, the first interlayer insulating layer 190 may be on the first gate electrode 170. The first interlayer insulating layer 190 may cover the first gate electrode 170 in the display area 10 on the gate insulating layer 150, and may not be located in the module-corresponding area 30. In other words, the first interlayer insulating layer 190 may not overlap the functional module 420. For example, the first interlayer insulating layer 190 may sufficiently cover the first gate electrode 170 on the gate insulating layer 150, and may have a substantially flat top surface without creating a step around the first gate electrode 170. In some embodiments, the first interlayer insulating layer 190 may be arranged along a profile of the first gate electrode 170 with a uniform thickness to cover the first gate electrode 170 on the gate insulating layer 150. The first interlayer insulating layer 190 may include, for example, a silicon compound, metal oxide, and the like. In other embodiments, the first interlayer insulating layer 190 may have a multilayer structure including a plurality of insulating layers. The insulating layers may include mutually different materials, and may have mutually different thicknesses.

The second gate electrode 175 may be arranged in the display area 10 on the first interlayer insulating layer 190. The second gate electrode 175 may be arranged on a portion of the first interlayer insulating layer 190 under which the first gate electrode 170 is located. In some embodiments, the first gate electrode 170 and the second gate electrode 175 may function as a capacitor. The second gate electrode 175 may include a metal, an alloy, metal nitride, conductive metal oxide, a transparent conductive material, and the like. These may be used alone or in combination with each other. In other embodiments, the second gate electrode 175 may have a multilayer structure including a plurality of metal layers. The metal layers may include mutually different materials, and may have mutually different thicknesses.

The second interlayer insulating layer 195 may be arranged on the second gate electrode 175. The second interlayer insulating layer 195 may cover the second gate electrode 175 in the display area 10 on the first interlayer insulating layer 190, and may not be located in the module-corresponding area 30. In other words, the second interlayer insulating layer 195 may not overlap the functional module 420. For example, the second interlayer insulating layer 195 may sufficiently cover the second gate electrode 175 on the first interlayer insulating layer 190, and may have a substantially flat top surface without creating a step around the second gate electrode 175. In some embodiments, the second interlayer insulating layer 195 may be arranged along a profile of the second gate electrode 175 with a substantially uniform thickness to cover the second gate electrode 175 on the first interlayer insulating layer 190. The second interlayer insulating layer 195 may include a silicon compound, metal oxide, and the like. In other embodiments, the second interlayer insulating layer 195 may have a multilayer structure including a plurality of insulating layers. The insulating layers may include mutually different materials, and may have mutually different thicknesses.

The source electrode 210 and the drain electrode 230 may be arranged in the display area 10 on the second interlayer insulating layer 195. The source electrode 210 may be connected to the source region of the active layer 130 through a contact hole formed by removing first portions of the gate insulating layer 150, the first interlayer insulating layer 190, and the second interlayer insulating layer 195. In some embodiments, the drain electrode 230 may be connected to the drain region of the active layer 130 through a contact hole formed by removing second portions of the gate insulating layer 150, the first interlayer insulating layer 190, and the second interlayer insulating layer 195. Each of the source electrode 210 and the drain electrode 230 may include, for example, a metal, an alloy, metal nitride, conductive metal oxide, a transparent conductive material, and the like. These example materials may be used alone or in combination with each other. In other embodiments, each of the source electrode 210 and the drain electrode 230 may have a multilayer structure including a plurality of metal layers. The metal layers may include mutually different materials, and may have mutually different thicknesses.

Accordingly, the semiconductor element 250 including the active layer 130, the first gate electrode 170, the second gate electrode 175, the source electrode 210, and the drain electrode 230 may be arranged in the first sub-pixel area 31.

Although the semiconductor element 250 has been described as having a top gate structure, the configuration of the present disclosure is not limited thereto. For example, in some embodiments, the semiconductor element 250 may have a bottom gate structure.

In addition, although the display device 100 has been described as including one semiconductor element, the configuration of the present disclosure is not limited thereto. For example, the display device 100 may include at least one semiconductor element and at least one capacitor.

In some embodiments, the planarization layer 270 may be arranged on the semiconductor element 250 in the display area 10 and the buffer layer 115 in the module-corresponding area 30. In other words, the planarization layer 270 may cover the source electrode 210 and the drain electrode 230 in the display area 10, may extend to the module-corresponding area 30, and may be on the buffer layer 115 in the module-corresponding area 30. The planarization layer 270 may have a relatively thick thickness. The planarization layer 270 may be formed of an organic insulating material or an inorganic insulating material. In some embodiments, the planarization layer 270 may include an organic insulating material. For example, the planarization layer 270 may include a photoresist, a polyacryl-based resin, a polyimide-based resin, a polyamide-based resin, a siloxane-based resin, an acryl-based resin, an epoxy-based resin, and the like. In some embodiments, the planarization layer 270 may be formed of a substantially transparent siloxane-based resin.

The connection electrode 235 may be in the display area 10 on the planarization layer 270. The connection electrode 235 may be connected to the drain electrode 230 through a contact hole formed by removing a portion of the planarization layer 270 located in the display area 10, and the connection electrode 235 may electrically connect the second lower electrode 290 to the drain electrode 230. In some embodiments, the connection electrode 235 may not be connected to the drain electrode 230, but may be electrically connected to a semiconductor element (other than a semiconductor element 250) through a contact hole in another sectional view of the display device 100. The connection electrode 235 may include, for example, a metal, an alloy, metal nitride, conductive metal oxide, a transparent conductive material, and the like. These may be used alone or in combination with each other. In other embodiments, each of connection electrodes 235 may have a multilayer structure including a plurality of metal layers. The metal layers may include mutually different materials, and may have mutually different thicknesses.

The signal wire 610 may be in the module-corresponding area 30 on the planarization layer 270. As shown in FIG. 5, the signal wire 610 may be electrically connected to the first lower electrode 295 through a contact hole formed by removing a portion of the insulating layer 275 located in the module-corresponding area 30, and the signal wire 610 may extend from the module-corresponding area 30 to the pixel circuit area 20 for the module-corresponding area 30 so as to be electrically connected to the pixel circuit structure 620 for the module-corresponding area 30.

In some embodiments, the connection electrode 235 and the signal wire 610 may be located on the same layer. In addition, a thickness of the signal wire 610 may be less than a thickness of the connection electrode 235. In some embodiments, the signal wire 610 may be substantially transparent.

The signal wire 610 may include conductive metal oxide, a transparent conductive material, and the like. For example, the signal wire 610 may include a transparent conductive oxide such as indium tin oxide (ITO), indium zinc oxide (IZO), indium gallium oxide (IGO), tin oxide ($SnO_2$), and zinc oxide (ZnO).

In other embodiments, a protective layer may be interposed between the planarization layer 270 and the signal wire. In this case, the protective layer may cover both side portions of the connection electrode 235.

The insulating layer 275 may be on the planarization layer 270, the connection electrode 235, and the signal wire 610. In other words, the insulating layer 275 may cover the connection electrode 235 in the display area 10 on the planarization layer 270, may extend to the module-corresponding area 30, and may cover the signal wire 610 in the module-corresponding area 30 on the planarization layer 270. The insulating layer 275 may have a substantially flat top surface. The insulating layer 275 may be formed of an organic insulating material or an inorganic insulating material. In some embodiments, the insulating layer 275 may include an organic insulating material. Yet in other embodiments, the insulating layer 275 may be formed of substantially transparent photosensitive polyimide (PSPI). In other words, the planarization layer 270 and the insulating layer 275 may include mutually different materials.

The second lower electrode 290 may be in the display area 10 on the insulating layer 275. The second lower electrode 290 may be connected to the connection electrode 235 through a contact hole formed by removing a portion of the insulating layer 275, and the second lower electrode 290 may be electrically connected to the semiconductor element 250. The second lower electrode 290 may include, for example, a metal, an alloy, metal nitride, conductive metal oxide, a transparent conductive material, and the like. These materials may be used alone or in combination with each other. In some embodiments, the second lower electrode 290 may have a multilayer structure including a plurality of metal layers. The metal layers may include mutually different materials, and may have mutually different thicknesses. For example, the second lower electrode 290 may have a stacked structure of ITO/Ag/ITO.

The low reflection layer 630 may be in the module-corresponding area 30 (e.g., the first sub-pixel area 41 for the module-corresponding area 30) on the insulating layer 275.

The low reflection layer 630 may make direct contact with the top surface of the insulating layer 275, which may be non-uniform, to assist in forming the high refraction layer 650, the first metal layer 297, and the second metal layer 298. The low reflection layer 630 may include a material having a relatively low reflectance for light. In other words, the low reflection layer 630 may include a material having a relatively high absorptance for light. The low reflection layer 630 may include a transparent conductive material. For example, the transparent conductive material may include one selected from molybdenum (Mo), titanium (Ti), zirconium (Zr), hafnium (Hf), vanadium (V), niobium (Nb), tantalum (Ta), chromium (Cr), and tungsten (W). In addition, a thickness of the low reflection layer 630 may be less than or equal to approximately 50 nanometers. In some embodiments, the low reflection layer 630 may include a titanium thin film. In other words, after a light L penetrates into the display device 100 from the outside of the display device 100 in the module-corresponding area 30, a part or a portion of the light L reflected from a top surface of the functional module 420 may be absorbed by the low reflection layer 630, and the rest of the light L may pass through the low reflection layer 630.

The high refraction layer 650 may be on the low reflection layer 630. The high refraction layer 650 may include a material having a relatively high refractive index for a light. The high refraction layer 650 may include a transparent conductive material. For example, the high refraction layer 650 may include indium tin zinc oxide (ITZO) or indium zinc oxide (IZO), which essentially includes indium oxide ($In_2O_3$) and titanium (Ti). In addition, a thickness of the high refraction layer 650 may be less than or equal to approximately 55 nanometers. Moreover, a refractive index of the high refraction layer 650 may be greater than or equal to approximately 1.9. In some embodiments, the high refraction layer 650 may include an ITZO thin film having a refractive index of approximately 2.3.

According to a display device, a first lower electrode in a module-corresponding area may have the same structure as a second lower electrode in a display area. For example, each of the first and second lower electrodes may have a stacked structure of ITO/Ag/ITO. A light may penetrate into the display device from the outside of the display device in the module-corresponding area, and the light may be reflected from a top surface of a functional module so as to be incident onto a bottom surface of the first lower electrode. A relatively large amount of the light may be reflected from the bottom surface of the first lower electrode, and the reflected light may be incident onto the functional module again. As a result, light interference may occur and an image acquired from the functional module may be distorted.

In the embodiments of the present disclosure, the light L may penetrate into the display device 100 from the outside of the display device 100 in the module-corresponding area 30, and the light L may be reflected from the top surface of the functional module 420 so as to be incident onto a bottom surface of the first lower electrode 295. A part of the light L incident onto the bottom surface of the first lower electrode 295 may be absorbed by the low reflection layer 630, and the rest of the light L may be divided into a first light reflected from a bottom surface of the low reflection layer 630, and a second light passing through the low reflection layer 630 and reflected from a bottom surface of the high refraction layer 650. The first light and the second light may be destroyed by destructive interference. Accordingly, to generate the second light passing through the low reflection layer 630 and reflected from the bottom surface of the high refraction layer 650, the high refraction layer 650 has a relatively high refractive index. In other words, the second lower electrode 290 may destroy light reflected from a bottom surface of the second lower electrode 290.

The first metal layer 297 may be on the high refraction layer 650. The first metal layer 297 may be opaque, and may function as a light reflection layer. The first metal layer 297 may reflect a light emitted from the first light emitting layer 335 to a front surface (e.g., the first surface S1) of the display device 100. Therefore, the first lower electrode 295 including the first metal layer 297 may be substantially opaque. In the embodiments, a thickness of the first metal layer 297 may be greater than a thickness of each of the low reflection layer 630, the high refraction layer 650, and the second metal layer 298. The first metal layer 297 may include, for example, silver (Ag), aluminum (Al), gold (Au), copper (Cu), palladium (Pd), platinum (Pt), or rubidium (Rb). In some embodiments, the first metal layer 297 may be formed of silver (Ag).

The second metal layer 298 may be on the first metal layer 297. The second metal layer 298 may include indium tin oxide (ITO). The second metal layer 298 may easily adjust color coordinates of the display device 100.

Accordingly, the first lower electrode 295 including the low reflection layer 630, the high refraction layer 650, the first metal layer 297, and the second metal layer 298 may be provided. As described above, in some embodiments, the first lower electrode 295 may be connected to the signal wire 610 through the contact hole formed by removing the portion of the insulating layer 275.

The pixel defining layer 310 may be arranged in the display area 10 and may be a part of the module-corresponding area 30 on the insulating layer 275 such that the pixel defining layer 310 may not be in the transparent area 35. The pixel defining layer 310 may expose a part of the second lower electrode 290 in the display area 10, and may expose a part of the first lower electrode 295 in the module-corresponding area 30. In addition, the pixel defining layer 310 may have an opening 315 (e.g., the transmission window 315 of FIG. 5) that exposes the transparent area 35. The pixel defining layer 310 may be formed of an organic insulating material or an inorganic insulating material. In some embodiments, the pixel defining layer 310 may include an organic insulating material. In some embodiments, the pixel defining layer 310 may be arranged in the transparent area 35 on the insulating layer 275.

The second light emitting layer 330 may be on the second lower electrode 290, and the first light emitting layer 335 may be on the first lower electrode 295. Each of the first light emitting layer 335 and the second light emitting layer 330 may be formed by using at least one of light emitting materials for emitting different color lights (i.e., a red light, a green light, a blue light, etc.) according to sub-pixels. In some embodiments, each of the first light emitting layer 335 and the second light emitting layer 330 may include a red light emitting material.

The upper electrode 340 may be arranged over substantially the entirety of the display area 10 and the module-corresponding area 30 on the substrate 110. The upper electrode 340 may be arranged along a profile of the first light emitting layer 335, the second light emitting layer 330, and the pixel defining layer 310. The upper electrode 340 may include, for example, a metal, an alloy, metal nitride, conductive metal oxide, a transparent conductive material, and the like. These materials may be used alone or in combination with each other. In other embodiments, the upper electrode 340 may have a multilayer structure including a plurality of metal layers. The metal layers may include mutually different materials, and may have mutually different thicknesses.

Accordingly, the light emitting structure 200 including the second lower electrode 290, the second light emitting layer 330, and the upper electrode 340 may be in the display area 10, and the light emitting structure 300 for the module-corresponding area 30, which includes the first lower electrode 295, the first light emitting layer 335, and the upper electrode 340, may be in the module-corresponding area 30.

The first inorganic thin film encapsulation layer 451 may be in the display area 10 and in the module-corresponding area 30 on the upper electrode 340. For example, the first inorganic thin film encapsulation layer 451 may be arranged along a profile of the upper electrode 340 in the display area 10 and in the module-corresponding area 30. The first inorganic thin film encapsulation layer 451 may prevent or reduce the light emitting structure 200 and the light emitting structure 300 for the module-corresponding area 30 from deteriorating due to penetration of moisture, oxygen, and the like. In addition, the first inorganic thin film encapsulation layer 451 may perform a function of protecting the light emitting structure 200 and the light emitting structure 300 for the module-corresponding area 30 from an external impact. The first inorganic thin film encapsulation layer 451 may include an inorganic insulating material having flexibility (e.g., elasticity).

The organic thin film encapsulation layer 452 may be in the display area 10 and the module-corresponding area 30 on the first inorganic thin film encapsulation layer 451. The organic thin film encapsulation layer 452 may improve flatness of the display device 100, and may protect the light emitting structure 200 and the light emitting structure 300 for the module-corresponding area 30 together with the first inorganic thin film encapsulation layer 451. The organic thin film encapsulation layer 452 may include an organic insulating material having flexibility (e.g., elasticity).

The second inorganic thin film encapsulation layer 453 may be on the organic thin film encapsulation layer 452. The second inorganic thin film encapsulation layer 453 may be arranged along a profile of the organic thin film encapsulation layer 452 with a uniform thickness to cover the organic thin film encapsulation layer 452 in the display area 10 and the module-corresponding area 30. The second inorganic thin film encapsulation layer 453, together with the first inorganic thin film encapsulation layer 451, may prevent or reduce the light emitting structure 200 and the light emitting structure 300 for the module-corresponding area from deteriorating due to the penetration of moisture, oxygen, and the like. In addition, the second inorganic thin film encapsulation layer 453 may perform a function of protecting the light emitting structure 200 and the light emitting structure 300 for the module-corresponding area 30 from an external impact together with the first inorganic thin film encapsulation layer 451 and the organic thin film encapsulation layer 452. The second inorganic thin film encapsulation layer 453 may include an inorganic insulating material having flexibility.

Accordingly, the thin film encapsulation layer 450 including the first inorganic thin film encapsulation layer 451, the organic thin film encapsulation layer 452, and the second inorganic thin film encapsulation layer 453 may be provided. In some embodiments, the thin film encapsulation layer 450 may have a five-layer structure in which first to fifth thin film encapsulation layers are stacked or a seven-layer structure in which first to seventh thin film encapsulation layers are stacked.

As described above, the display device 100 including the functional module 420, the substrate 110, the buffer layer 115, the gate insulating layer 150, the first interlayer insulating layer 190, the second interlayer insulating layer 195, the semiconductor element 250, the connection electrode 235, the planarization layer 270, the insulating layer 275, the light emitting structure 200, the light emitting structure 300 for the module-corresponding area 30, the pixel defining layer 310, the signal wire 610, the thin film encapsulation layer 450, and the like may be provided.

Because the display device 100 according to the embodiments of the present disclosure includes the low reflection layer 630, a part of the light L reflected from the top surface of the functional module 420 may be absorbed. In addition, because the display device 100 includes the low reflection layer 630 and the high refraction layer 650, the first light reflected from the bottom surface of the low reflection layer 630 and the second light passing through the low reflection layer 630 and reflected from the bottom surface of the high refraction layer 650 may be destroyed due to the destructive interference. Accordingly, the light interference may not occur so the image acquired from the functional module 420 may not be distorted.

FIGS. 8 to 18 are cross-sectional views showing a method for manufacturing a display device according to embodiments of the present disclosure.

Figure 8:
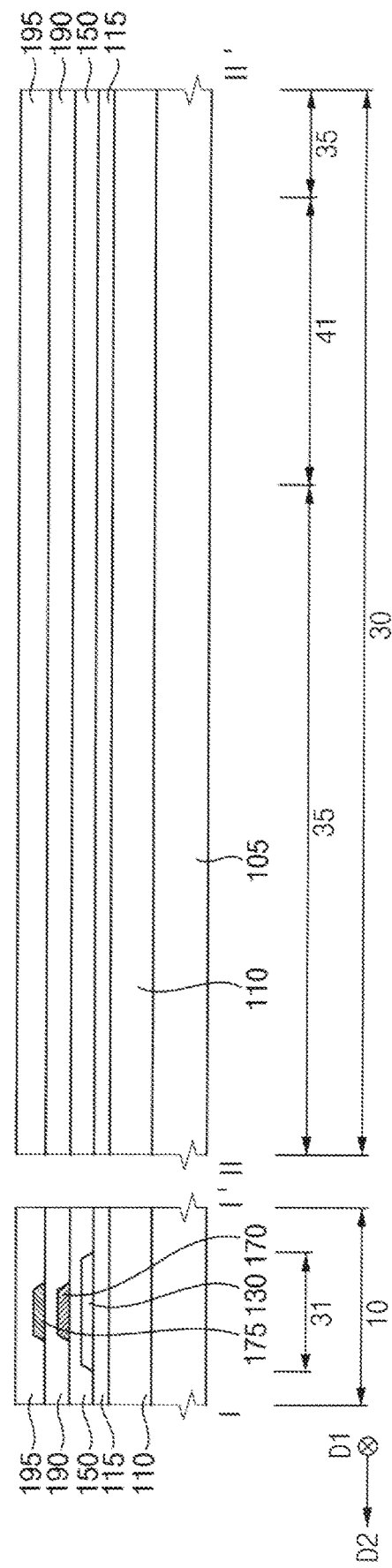
FIGS. 8 to 18 are cross-sectional views showing a method for manufacturing a display device, according to embodiments of the present disclosure.

Referring to FIG. 8, a rigid glass substrate 105 may be provided. The substrate 110 including transparent materials may be formed on the glass substrate 105. The substrate 110 may be formed by using a transparent resin substrate having flexibility. In some embodiments, the substrate 110 may have a configuration in which a first organic layer, a first barrier layer, a second organic layer, and a second barrier layer are sequentially stacked. The first barrier layer and the second barrier layer may be formed by using an inorganic material such as silicon oxide. In addition, the first organic layer and the second organic layer may be formed by using an organic insulating material such as a polyimide-based resin. In this case, each of the first and second barrier layers may block moisture penetrating through the first and second organic layers.

Because the substrate 110 is thin and flexible, the substrate 110 may be formed on the rigid glass substrate 105 to support formation of the semiconductor element 250, the light emitting structure 200, the light emitting structure 300 for the module-corresponding area 30, the thin film encapsulation layer 450, and the like. For example, the buffer layer 115 may be arranged on the second barrier layer of the substrate 110, and an upper structure (e.g., the semiconductor element 250, the light emitting structure 200, the light emitting structure 300 for the module-corresponding area 30, the thin film encapsulation layer 450) may be formed on the buffer layer 115. After the formation of the upper structure, the glass substrate may be removed. In other words, due to flexible physical properties of the substrate 110, it may be difficult to directly form the upper structure on the substrate 110. Therefore, the upper structure may be formed by using the rigid glass substrate, and then the glass substrate may be removed once the upper structure is formed, so that the first organic layer, the first barrier layer, the second organic layer, and the second barrier layer may be used as the substrate 110.

In some embodiments, the substrate 110 may include a display area 10, a module-corresponding area 30, and a pixel circuit area 20 for the module-corresponding area.

The buffer layer 115 may be formed on the substrate 110. For example, the buffer layer 115 may be formed over the entirety of the display area 10 and the module-corresponding area 30 on the substrate 110. When the surface of the substrate 110 is not uniform, the buffer layer 115 may serve to improve the flatness of the surface of the substrate 110. Depending on the type of the substrate 110, two or more buffer layers 115 may be provided on the substrate 110, or alternatively, no buffer layer 115 is formed. In some embodiments, the buffer layer 115 may be formed by using a silicon compound, metal oxide, and the like. In other embodiments, the buffer layer 115 may be formed only in the display area 10 without being formed in the module-corresponding area 30.

The active layer 130 may be formed in the display area 10 on the buffer layer 115. The active layer 130 may be formed by using, for example, a metal oxide semiconductor, an inorganic semiconductor, an organic semiconductor, or the like. In some embodiments, the active layer 130 may include a source region, a drain region, and a channel region located between the source region and the drain region.

The gate insulating layer 150 may be formed on the active layer 130. The gate insulating layer 150 may cover the active layer 130 in the display area 10 on the buffer layer 115, and may extend to the module-corresponding area 30. In other words, the gate insulating layer 150 may be formed over the whole buffer layer 115. For example, the gate insulating layer 150 may sufficiently cover the active layer 130 on the buffer layer 115, and may have a substantially flat top surface without creating a step around the active layer 130. The gate insulating layer 150 may be formed by using, for example, a silicon compound, metal oxide, and the like. For example, the gate insulating layer 150 may include $SiO_x$, $SiN_x$, $SiO_xN_y$, $SiO_xC_y$, $SiC_xN_y$, $AlO_x$, $AlN_x$, $TaO_x$, $HfO_x$, $ZrO_x$, $TiO_x$, and the like.

The first gate electrode 170 may be formed in the display area 10 on the gate insulating layer 150. The first gate electrode 170 may be formed on a portion of the gate insulating layer 150 under which the active layer 130 is located. The first gate electrode 170 may be formed by using, for example, a metal, an alloy, metal nitride, conductive metal oxide, a transparent conductive material, and the like. For example, the first gate electrode 170 may include Au, Ag, Al, Pt, Ni, Ti, Pd, Mg, Ca, Li, Cr, Ta, W, Cu, Mo, Sc, Nd, Ir, an aluminum-containing alloy, $AlN_x$, a silver-containing alloy, $WN_x$, a copper-containing alloy, a molybdenum-containing alloy, $TiN_x$, $CrN_x$, $TaN_x$, $SrRu_xO_y$, $ZnO_x$, ITO, $SnO_x$, $InO_x$, $GaO_x$, IZO, and the like. These materials may be used alone or in combination with each other.

The first interlayer insulating layer 190 may be formed on the first gate electrode 170. The first interlayer insulating layer 190 may cover the first gate electrode 170 in the display area 10 on the gate insulating layer 150, and may extend to the module-corresponding area 30. In other words, the first interlayer insulating layer 190 may be formed over the whole gate insulating layer 150. For example, the first interlayer insulating layer 190 may sufficiently cover the first gate electrode 170 on the gate insulating layer 150, and may have a substantially flat top surface without creating a step around the first gate electrode 170. In some embodiments, the first interlayer insulating layer 190 may be formed by using a silicon compound, metal oxide, and the like.

The second gate electrode 175 may be formed in the display area 10 on the first interlayer insulating layer 190. The second gate electrode 175 may be formed on a portion of the first interlayer insulating layer 190 under which the first gate electrode 170 is located. The second gate electrode 175 may be formed by using a metal, an alloy, metal nitride, conductive metal oxide, a transparent conductive material, and the like. These materials may be used alone or in combination with each other.

The second interlayer insulating layer 195 may be formed on the second gate electrode 175. The second interlayer insulating layer 195 may cover the second gate electrode 175 in the display area 10 on the first interlayer insulating layer 190, and may extend to the module-corresponding area 30. In other words, the second interlayer insulating layer 195 may be formed over the whole first interlayer insulating layer 190. For example, the second interlayer insulating layer 195 may sufficiently cover the second gate electrode 175 on the first interlayer insulating layer 190, and may have a substantially flat top surface without creating a step around the second gate electrode 175. In some embodiments, the second interlayer insulating layer 195 may be formed by using a silicon compound, metal oxide, and the like.

Figure 9:
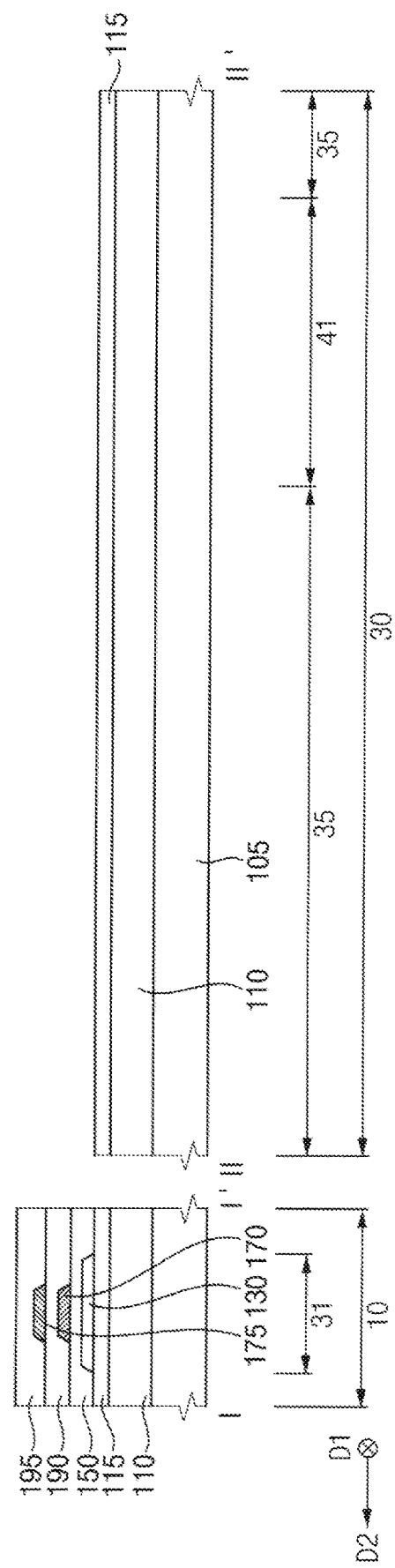

Referring to FIG. 9, the gate insulating layer 150, the first interlayer insulating layer 190, and the second interlayer insulating layer 195 in the module-corresponding area 30 may be removed.

Figure 10:
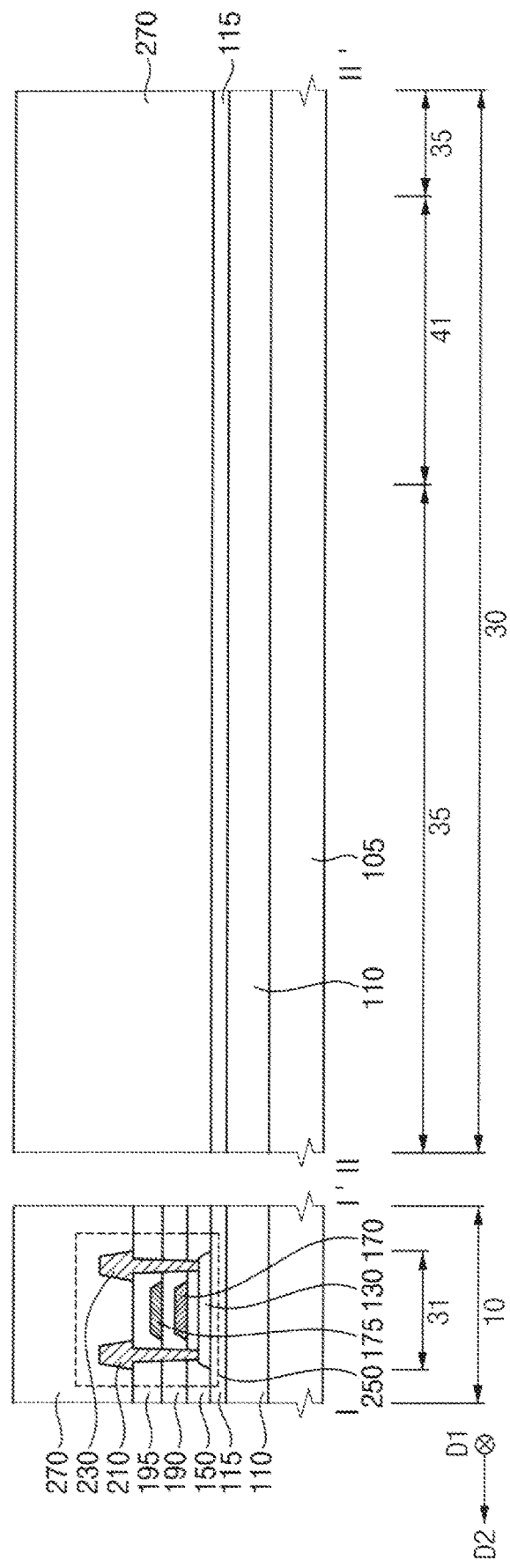

Referring to FIG. 10, the source electrode 210 and the drain electrode 230 may be formed in the display area 10 on the second interlayer insulating layer 195. The source electrode 210 may be connected to the source region of the active layer 130 through the contact hole formed by removing the first portions of the gate insulating layer 150, the first interlayer insulating layer 190, and the second interlayer insulating layer 195. The drain electrode 230 may be connected to the drain region of the active layer 130 through the contact hole formed by removing the second portions of the gate insulating layer 150, the first interlayer insulating layer 190, and the second interlayer insulating layer 195. Each of the source electrode 210 and the drain electrode 230 may be formed by using, for example, a metal, an alloy, metal nitride, conductive metal oxide, a transparent conductive material, and the like. These may be used alone or in combination with each other.

Accordingly, the semiconductor element 250 including the active layer 130, the first gate electrode 170, the second gate electrode 175, the source electrode 210, and the drain electrode 230 may be formed in the first sub-pixel area 31.

The planarization layer 270 may be formed on the semiconductor element 250 formed in the display area 10 and the buffer layer 115 formed in the module-corresponding area 30. In other words, the planarization layer 270 may cover the source electrode 210 and the drain electrode 230 in the display area 10, may extend to the module-corresponding area 30, and may be formed on the buffer layer 115 in the module-corresponding area 30. The planarization layer 270 may be relatively thick. In some embodiments, the planarization layer 270 may have a substantially flat top surface. To implement a flat top surface of the planarization layer 270, a planarization process may be additionally performed on the planarization layer 270. In some embodiments, the planarization layer 270 may be formed by using an organic insulating material. For example, the planarization layer 270 may include a photoresist, a polyacryl-based resin, a polyimide-based resin, a polyamide-based resin, a siloxane-based resin, an acryl-based resin, an epoxy-based resin, and the like. In some embodiments, the planarization layer 270 may be formed of a substantially transparent siloxane-based resin.

Figure 11:
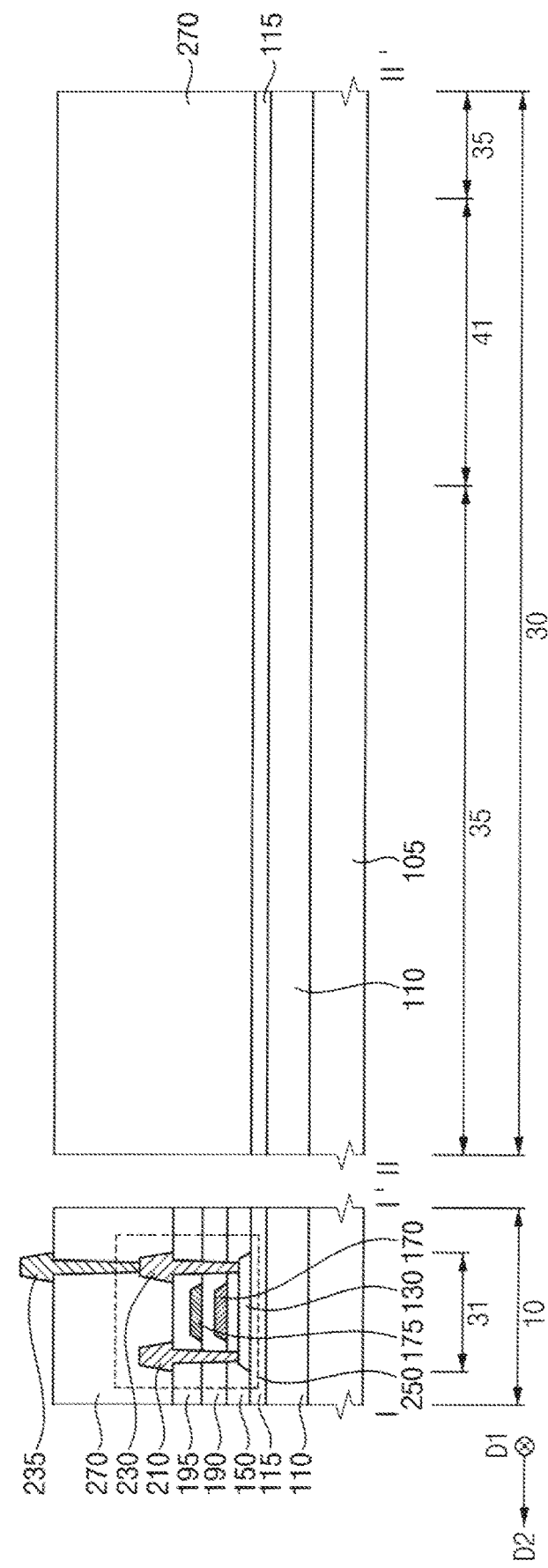

Referring to FIG. 11, the connection electrode 235 may be formed in the display area 10 on the planarization layer 270. The connection electrode 235 may be connected to the drain electrode 230 through the contact hole formed by removing the portion of the planarization layer 270 located in the display area 10. The connection electrode 235 may be formed by using, for example, a metal, an alloy, metal nitride, conductive metal oxide, a transparent conductive material, and the like. These may be used alone or in combination with each other.

Figure 12:
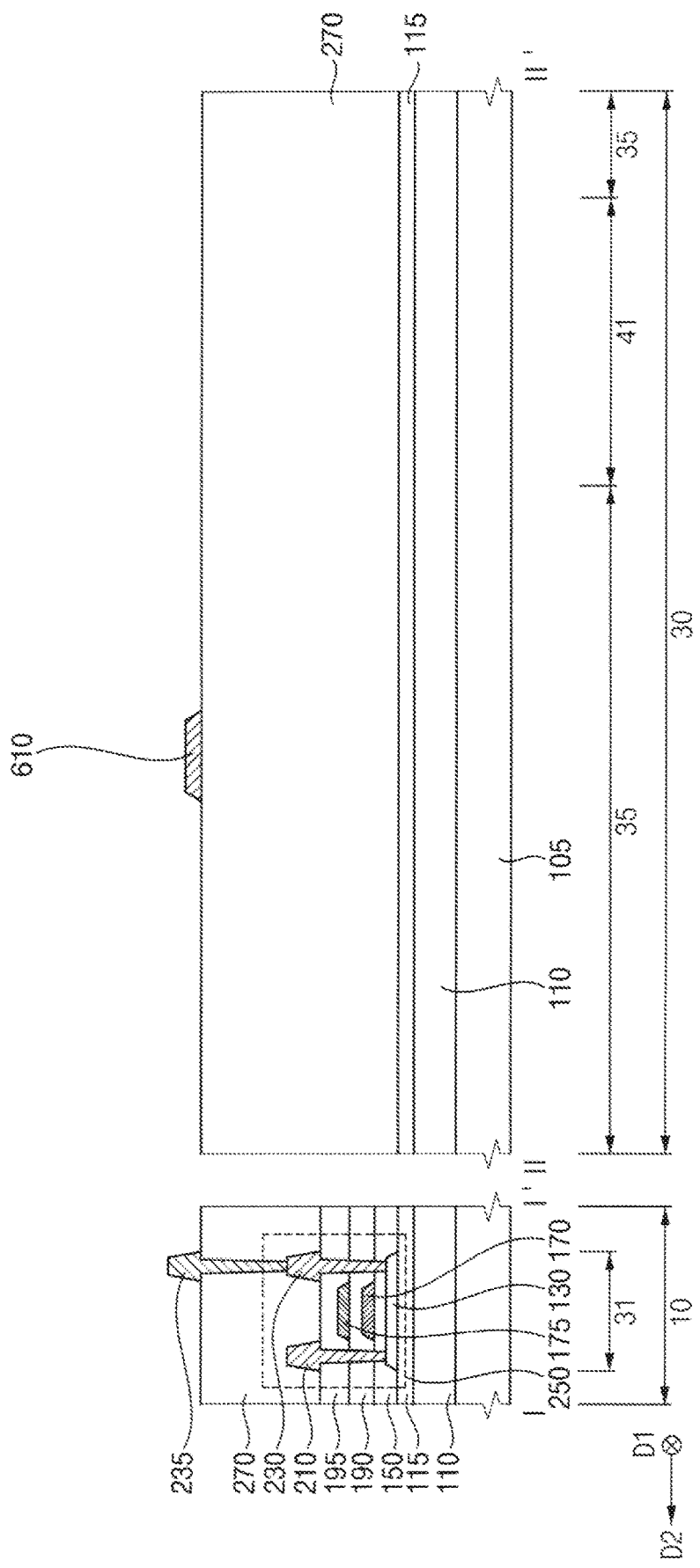

Referring to FIG. 12, the signal wire 610 may be formed in the module-corresponding area 30 on the planarization layer 270. The signal wire 610 may be formed by using, for example, conductive metal oxide, a transparent conductive material, and the like. For example, the signal wire 610 may include a transparent conductive oxide such as ITO, IZO, IGO, $SnO_2$, and ZnO.

In some embodiments, the connection electrode 235 and the signal wire 610 may be formed on the same layer, but may be formed by using mutually different materials in mutually different processes. For example, the signal wire 610 may be formed after the connection electrode 235 is formed. Accordingly, a protective insulating layer may be formed between the connection electrode 235 and the signal wire 610 to protect the connection electrode 235 during the process of patterning the signal wire 610.

Figure 13:
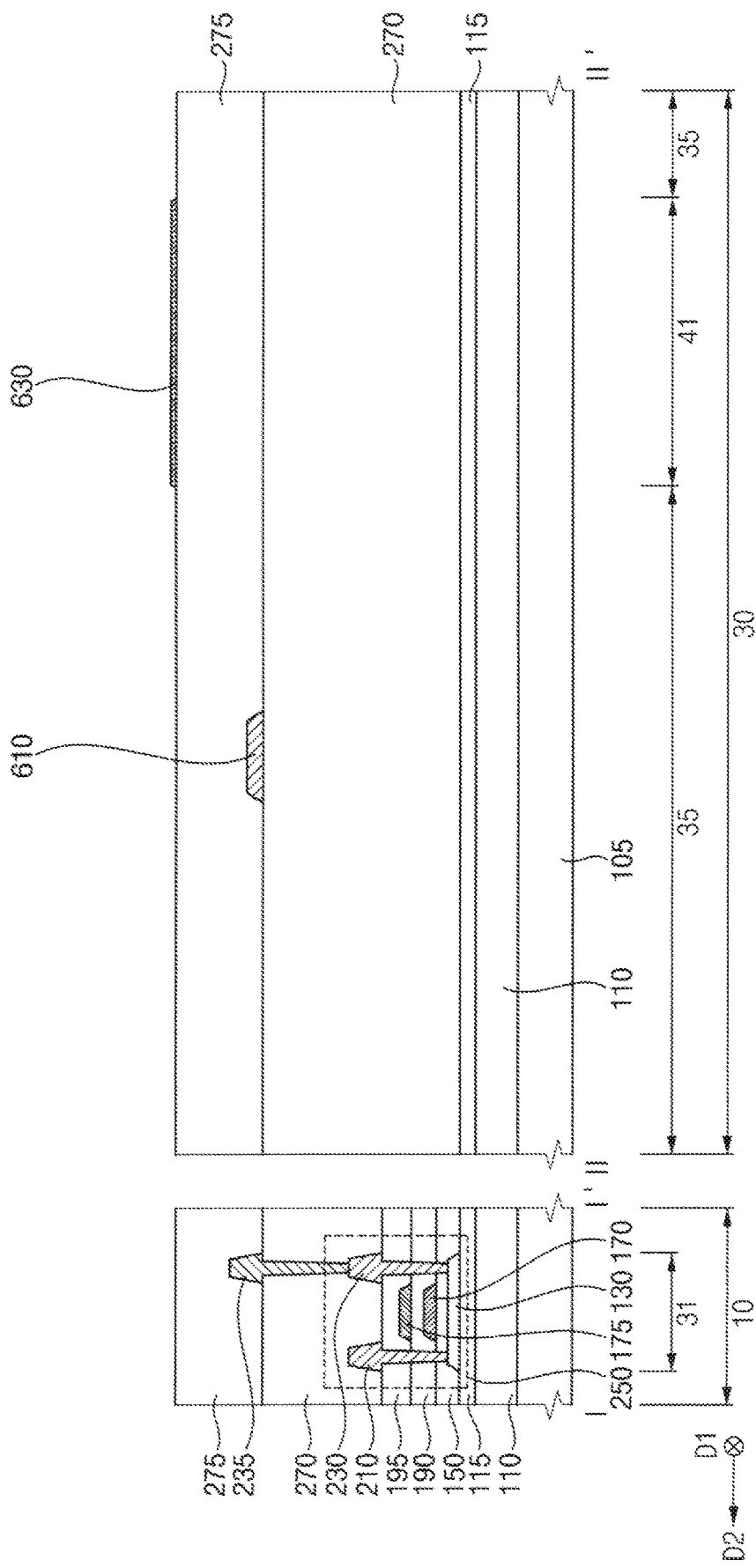

Referring to FIG. 13, the insulating layer 275 may be formed on the planarization layer 270, the connection electrode 235, and the signal wire 610. In other words, the insulating layer 275 may cover the connection electrode 235 in the display area 10 on the planarization layer 270, may extend to the module-corresponding area 30, and may cover the signal wire 610 in the module-corresponding area 30 on the planarization layer 270. In some embodiments, the insulating layer 275 may have a substantially flat top surface. To implement a flat top surface of the insulating layer 275, a planarization process may be additionally performed on the insulating layer 275. The insulating layer 275 may be formed by using an organic insulating material. In some embodiments, the insulating layer 275 may be formed by a substantially transparent photosensitive polyimide (PSPI). In other words, the planarization layer 270 and the insulating layer 275 may include mutually different materials.

The low reflection layer 630 may be formed in the module-corresponding area 30 on the insulating layer 275. The low reflection layer 630 may be formed by using a material having a relatively low reflectance for a light. The low reflection layer 630 may include a transparent conductive material. For example, the transparent conductive material may include one selected from Mo, Ti, Zr, Hf, V, Nb, Ta, Cr, and W. In addition, the thickness of the low reflection layer 630 may be less than or equal to approximately 50 nanometers. In some embodiments, the low reflection layer 630 may include a titanium thin film.

Figure 14:
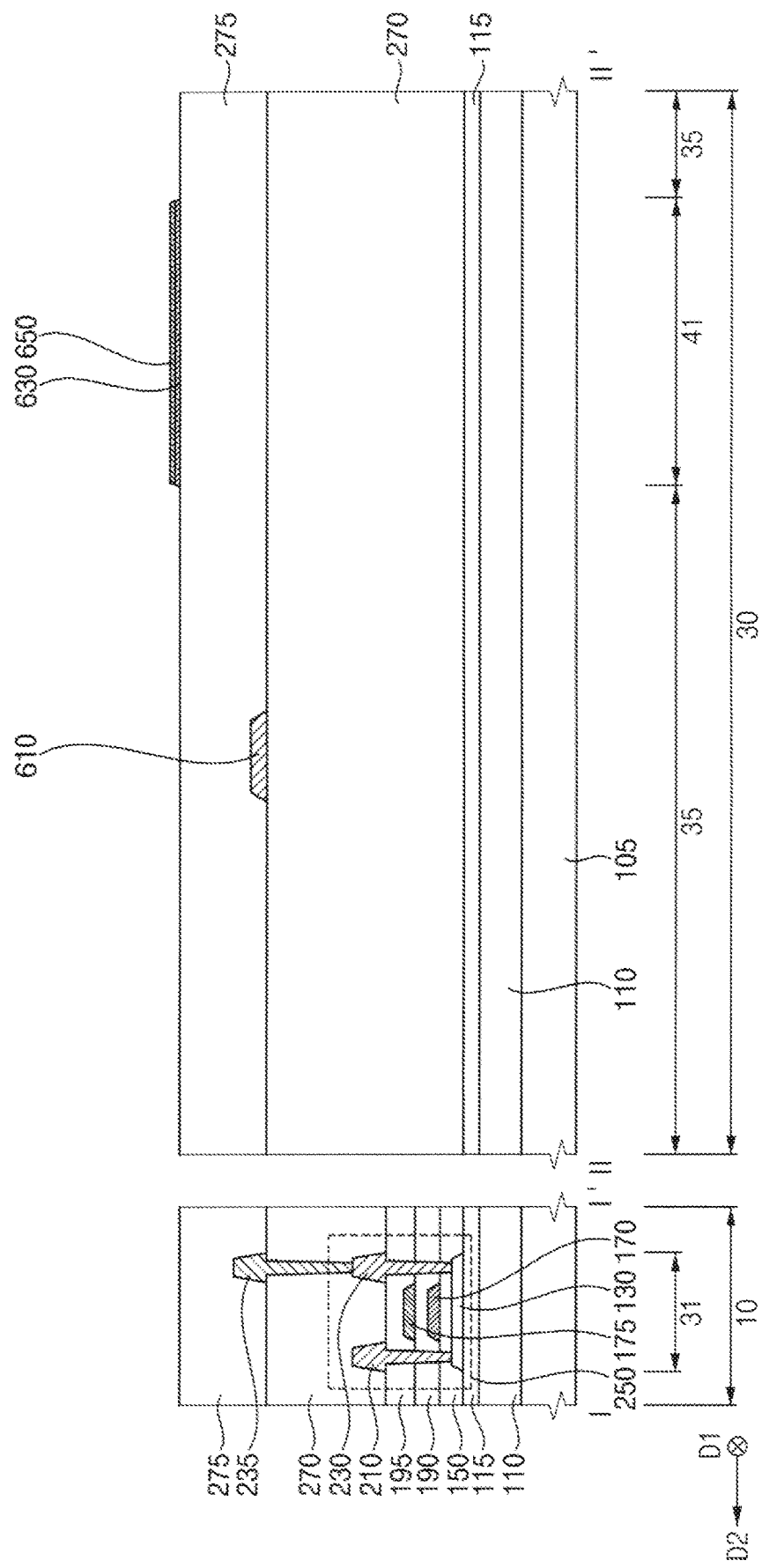

Referring to FIG. 14, the high refraction layer 650 may be formed on the low reflection layer 630. The high refraction layer 650 may be formed by using a material having a relatively high refractive index for a light. The high refraction layer 650 may include a transparent conductive material. For example, the high refraction layer 650 may include ITZO or IZO essentially including $In_2O_3$ and Ti. In some embodiments, the thickness of the high refraction layer 650 may be less than or equal to approximately 55 nanometers. Moreover, the refractive index of the high refraction layer 650 may be greater than or equal to approximately 1.9. In the embodiments, the high refraction layer 650 may include an ITZO thin film having a refractive index of approximately 2.3.

Figure 15:
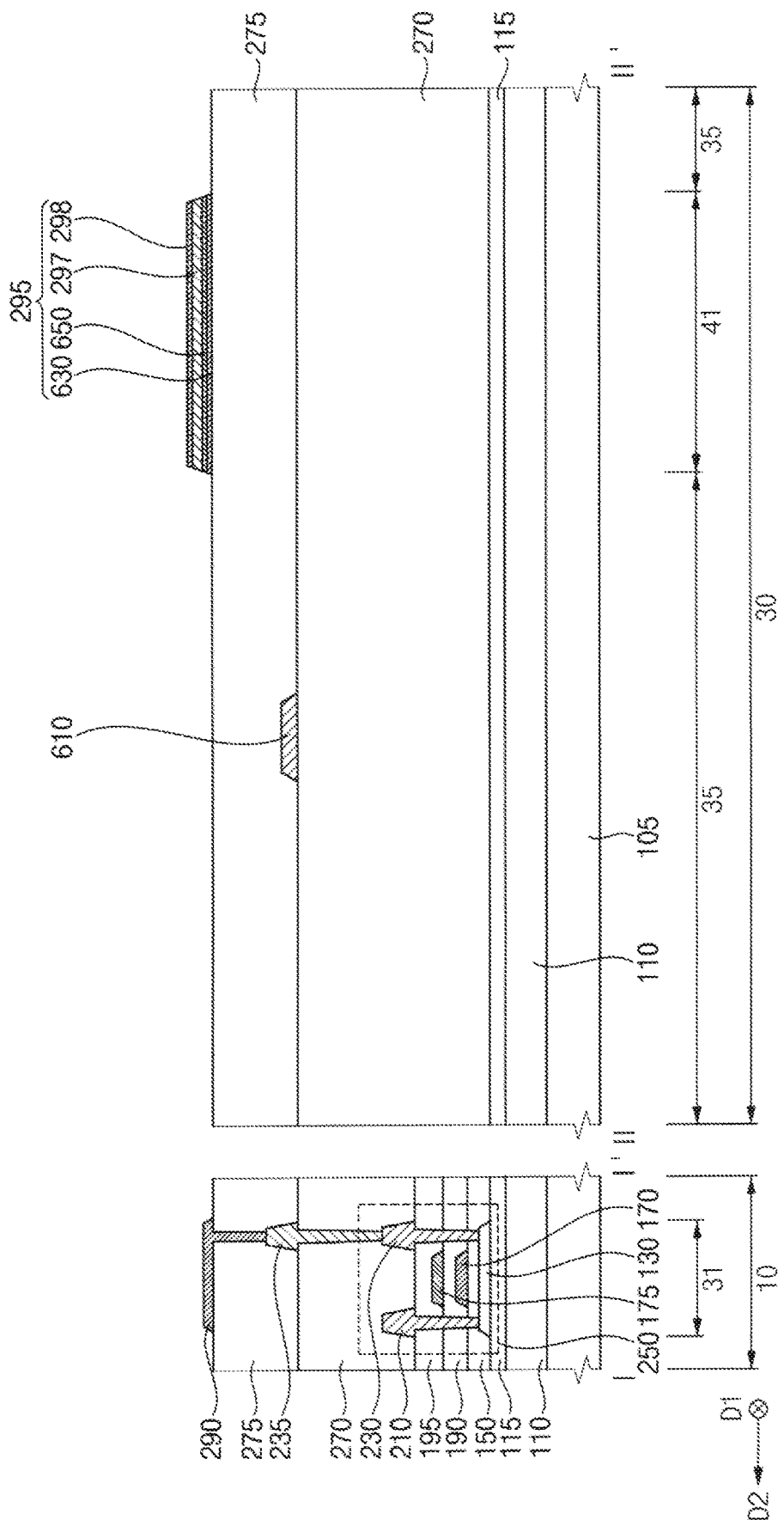

Referring to FIG. 15, the second lower electrode 290 may be formed in the display area 10 on the insulating layer 275. The second lower electrode 290 may be connected to the connection electrode 235 through the contact hole formed by removing the portion of the insulating layer 275. The second lower electrode 290 may be formed by using, for example, a metal, an alloy, metal nitride, conductive metal oxide, a transparent conductive material, and the like. These materials may be used alone or in combination with each other. In some embodiments, the second lower electrode 290 may have a multilayer structure including a plurality of metal layers. The metal layers may include mutually different materials, and may have mutually different thicknesses. For example, the second lower electrode 290 may have a stacked structure of ITO/Ag/ITO.

The first metal layer 297 may be formed on the high refraction layer 650. The first metal layer 297 may be opaque, and may function as a light reflection layer. The first metal layer 297 may be substantially opaque. The first metal layer 297 may be formed by using, for example, Ag, Al, Au, Cu, Pd, Pt, or Rb. In some embodiments, the first metal layer 297 may be formed of Ag. In some embodiments, the first metal layer 297 may be simultaneously formed with Ag when the second lower electrode 290 is formed.

The second metal layer 298 may be formed on the first metal layer 297. The second metal layer 298 may be formed by using, for example, ITO.

Accordingly, the first lower electrode 295 including the low reflection layer 630, the high refraction layer 650, the first metal layer 297, and the second metal layer 298 may be formed.

Figure 16:
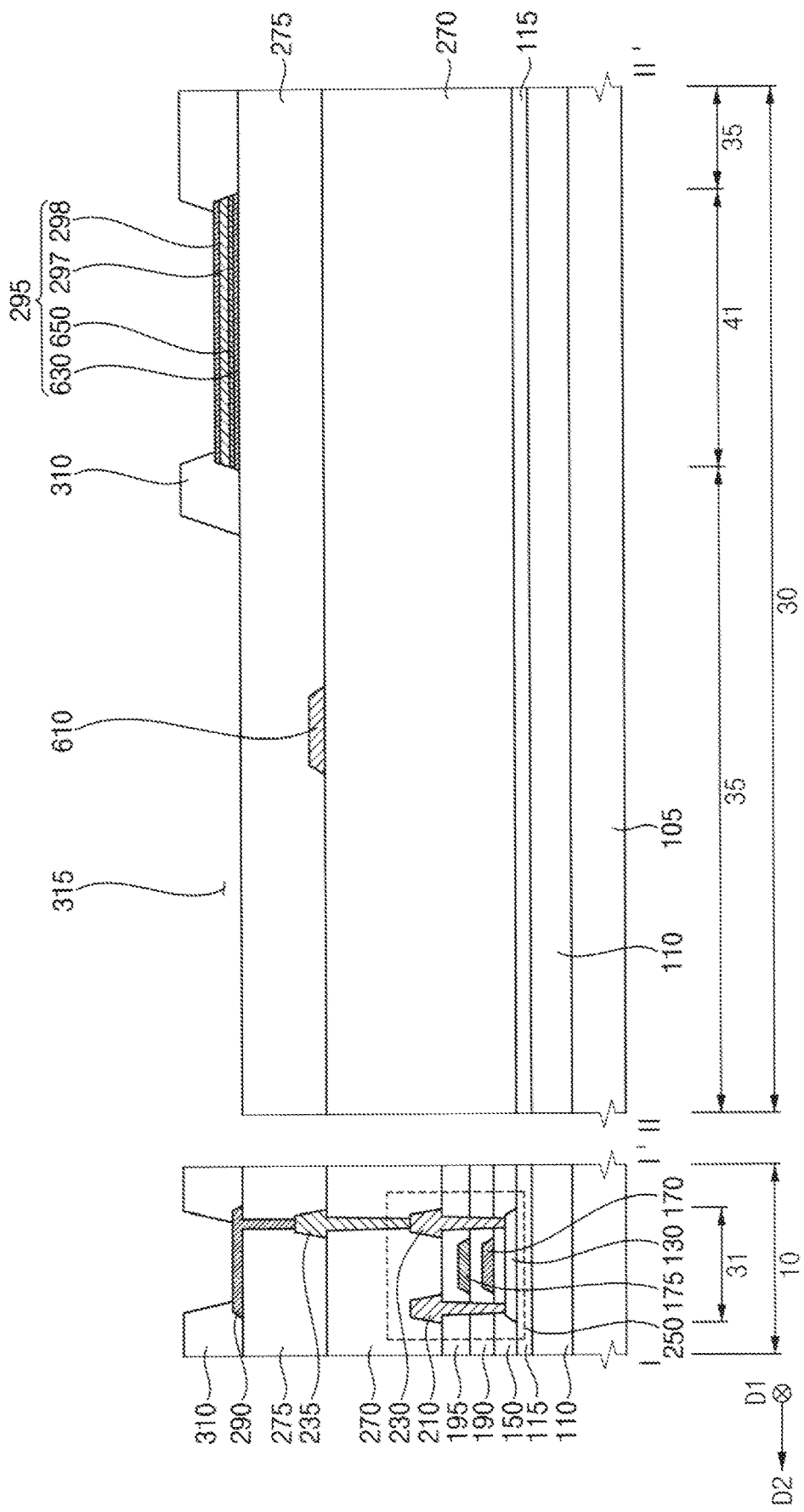

Referring to FIG. 16, the pixel defining layer 310 may be formed in the display area 10 and in a part of the module-corresponding area 30 on the insulating layer 275 such that the pixel defining layer 310 may be omitted from the transparent area 35. The pixel defining layer 310 may expose a part of the second lower electrode 290 in the display area 10, and may expose a part of the first lower electrode 295 in the module-corresponding area 30. In addition, the pixel defining layer 310 may have the opening/transmission window 315 that exposes the transparent area 35. The pixel defining layer 310 may be formed by using an organic insulating material.

Figure 17:
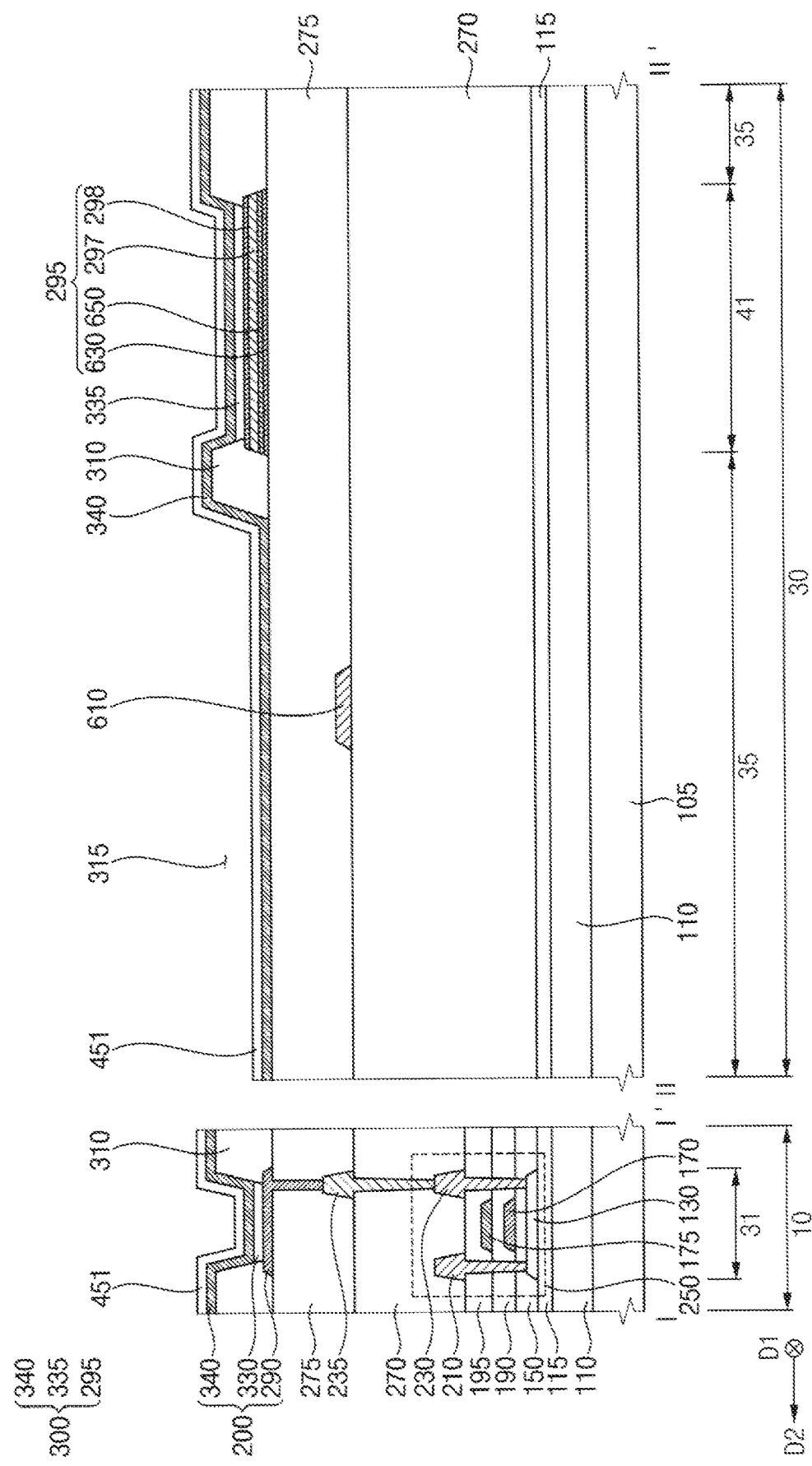

Referring to FIG. 17, the second light emitting layer 330 may be formed on the second lower electrode 290, and the first light emitting layer 335 may be formed on the first lower electrode 295. Each of the first light emitting layer 335 and the second light emitting layer 330 may be formed by using at least one of light emitting materials for emitting different color lights according to the sub-pixels.

The upper electrode 340 may be formed over the entirety of the display area 10 and the module-corresponding area 30 on the substrate 110. The upper electrode 340 may be formed along the profile of the first light emitting layer 335, the second light emitting layer 330, and the pixel defining layer 310. The upper electrode 340 may be formed by using a metal, an alloy, metal nitride, conductive metal oxide, a transparent conductive material, and the like. These may be used alone or in combination with each other.

Accordingly, the light emitting structure 200 including the second lower electrode 290, the second light emitting layer 330, and the upper electrode 340 may be formed in the display area 10, and the light emitting structure 300 for the module-corresponding area 30, which includes the first lower electrode 295, the first light emitting layer 335, and the upper electrode 340, may be formed in the module-corresponding area 30.

The first inorganic thin film encapsulation layer 451 may be formed in the display area 10 and the module-corresponding area 30 on the upper electrode 340. For example, the first inorganic thin film encapsulation layer 451 may be formed along the profile of the upper electrode 340 in the display area 10 and the module-corresponding area 30. The first inorganic thin film encapsulation layer 451 may be formed by using a flexible material such as an inorganic insulating.

Figure 18:
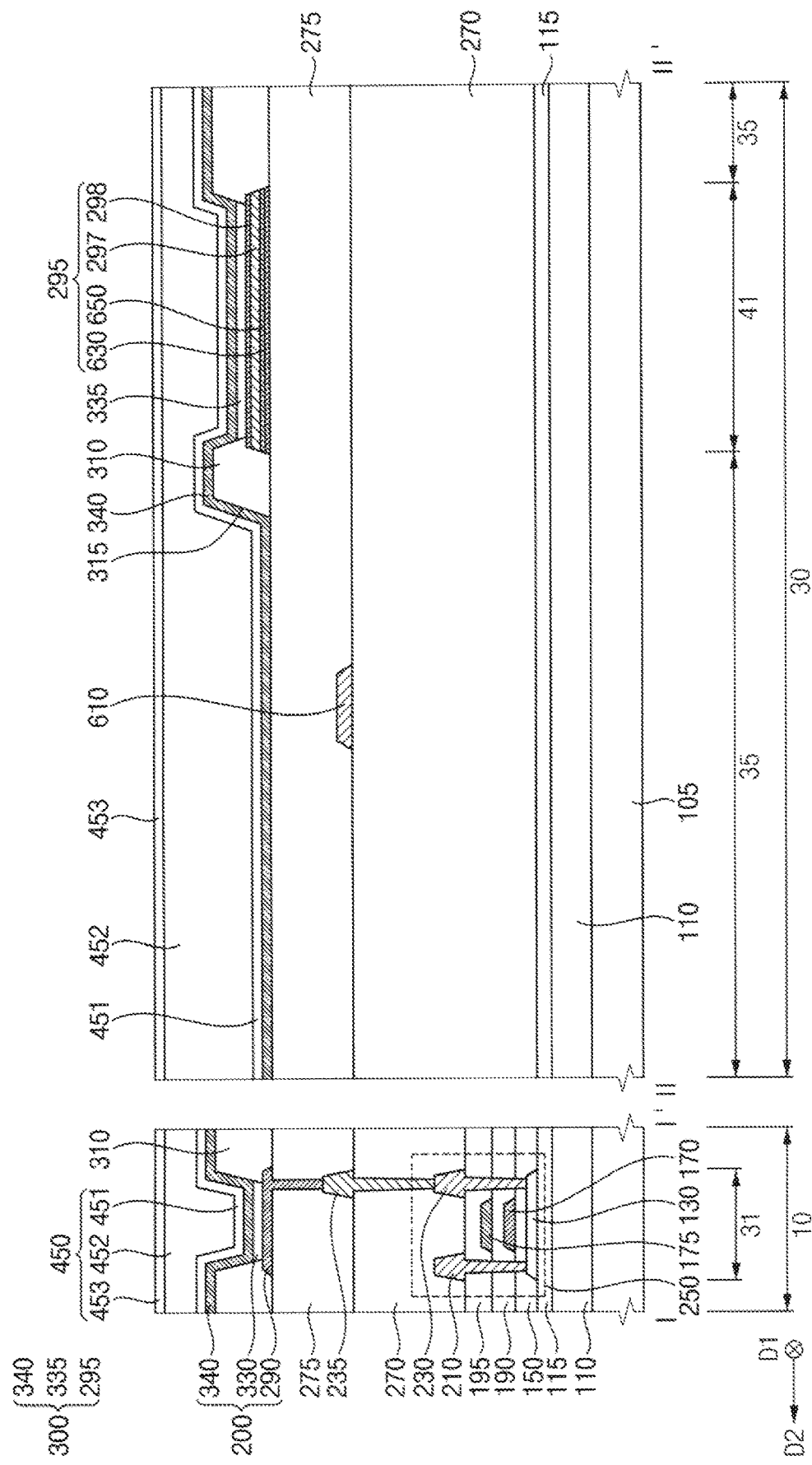

Referring to FIG. 18, the organic thin film encapsulation layer 452 may be formed in the display area 10 and the module-corresponding area 30 on the first inorganic thin film encapsulation layer 451. The organic thin film encapsulation layer 452 may be formed by using an organic insulating material having flexibility.

The second inorganic thin film encapsulation layer 453 may be formed on the organic thin film encapsulation layer 452. The second inorganic thin film encapsulation layer 453 may be formed along the profile of the organic thin film encapsulation layer 452 with a substantially uniform thickness to cover the organic thin film encapsulation layer 452 in the display area 10 and the module-corresponding area 30. The second inorganic thin film encapsulation layer 453 may be formed by using a flexible material such as an inorganic insulating.

Accordingly, the thin film encapsulation layer 450 including the first inorganic thin film encapsulation layer 451, the organic thin film encapsulation layer 452, and the second inorganic thin film encapsulation layer 453 may be formed.

After the thin film encapsulation layer 450 is formed, the glass substrate 105 may be removed from the substrate 110.

Referring to FIG. 6, the functional module 420 may be formed in the module-corresponding area 30 on the bottom surface of the substrate 110. The functional module 420 may include a camera module.

Accordingly, the display device 100 shown in FIGS. 1 to 7 may be manufactured.

Figure 19:
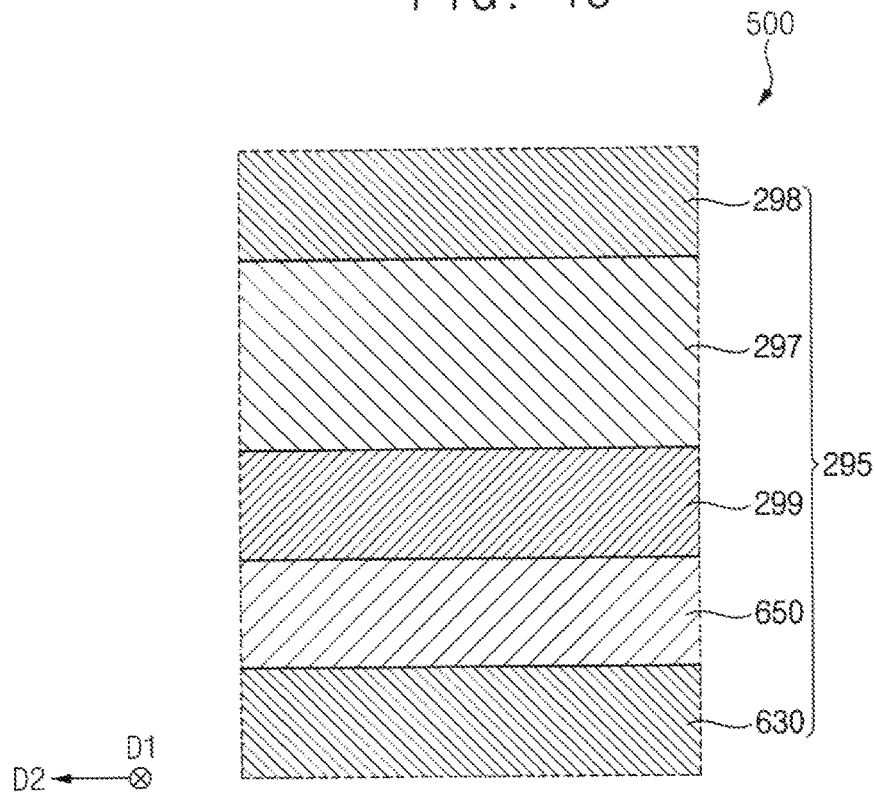
FIG. 19 is a cross-sectional view showing a display device, according to embodiments of the present disclosure.

FIG. 19 is a cross-sectional view showing a display device according to embodiments of the present disclosure. A display device 500 illustrated in FIG. 19 may have a configuration that is substantially identical or similar to the configuration of the display device 100 described with reference to FIGS. 1 to 7 except for a third metal layer 299. In FIG. 19, redundant descriptions of components that are substantially identical or similar to the components described with reference to FIGS. 1 to 7 will be omitted. For example, FIG. 19 may correspond to a partially enlarged plan view showing the region B of FIG. 6.

Referring to FIGS. 6 and 19, the display device 500 may include a functional module 420, a substrate 110, a buffer layer 115, a gate insulating layer 150, a first interlayer insulating layer 190, a second interlayer insulating layer 195, a semiconductor element 250, a connection electrode 235, a planarization layer 270, an insulating layer 275, a light emitting structure 200, a light emitting structure 300 for a module-corresponding area 30, a pixel defining layer 310, a signal wire 610, a thin film encapsulation layer 450, and the like. In some embodiments, the first lower electrode 295 may include a low reflection layer 630, a high refraction layer 650, a third metal layer 299, a first metal layer 297, and a second metal layer 298.

The third metal layer 299 may be arranged between the high refraction layer 650 and the first metal layer 297. The third metal layer 299 may include, for example, indium tin oxide (ITO).

The second lower electrode 290 may have a stacked structure of ITO/Ag/ITO, and the third metal layer 299, the first metal layer 297, and the second metal layer 298 of the first lower electrode 295 may also have a stacked structure of ITO/Ag/ITO. In other words, the low reflection layer 630 and the high refraction layer 650 may be formed on the insulating layer 275, and the second lower electrode 290 may be formed concurrently (e.g., substantially simultaneously) with the third metal layer 299, the first metal layer 297, and the second metal layer 298.

Figure 20:
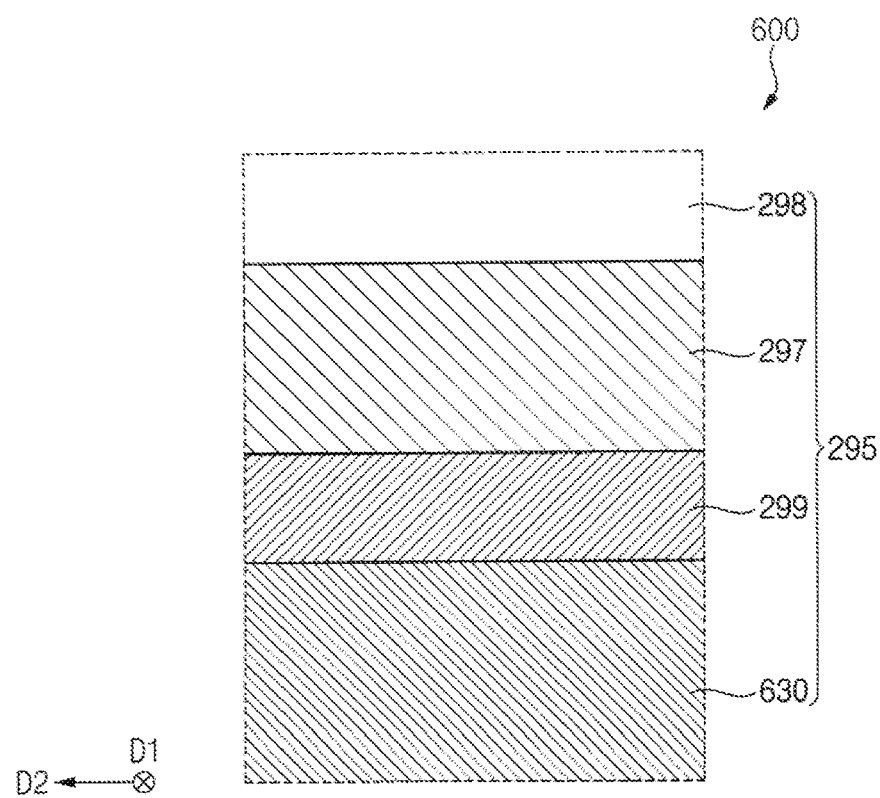
FIG. 20 is a cross-sectional view showing display devices, according to embodiments of the present disclosure.
Figure 21:
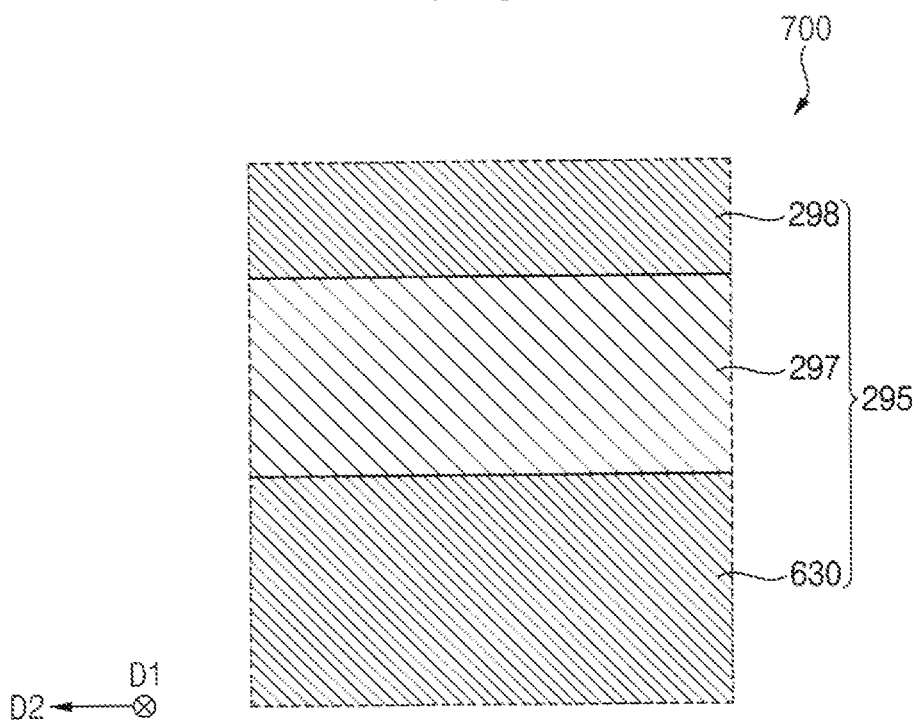
FIG. 21 is a cross-sectional view showing display devices, according to embodiments of the present disclosure.

FIGS. 20 and 21 are cross-sectional views showing display devices according to embodiments of the present disclosure. Each of display devices 600 and 700 illustrated in FIGS. 20 and 21 may have a configuration that is substantially identical or similar to the configuration of the display device 100 described with reference to FIGS. 1 to 7 except for a low reflection layer 630 including a molybdenum alloy. In FIGS. 20 and 21, redundant descriptions of components that are substantially identical or similar to the components described with reference to FIGS. 1 to 7 will be omitted. For example, FIGS. 20 and 21 may correspond to partially enlarged plan views showing the region B of FIG. 6.

Referring to FIGS. 6 and 20, the display device 600 may include a functional module 420, a substrate 110, a buffer layer 115, a gate insulating layer 150, a first interlayer insulating layer 190, a second interlayer insulating layer 195, a semiconductor element 250, a connection electrode 235, a planarization layer 270, an insulating layer 275, a light emitting structure 200, a light emitting structure 300 for a module-corresponding area 30, a pixel defining layer 310, a signal wire 610, a thin film encapsulation layer 450, and the like. In some embodiments, the first lower electrode 295 may include a low reflection layer 630, a third metal layer 299, a first metal layer 297, and a second metal layer 298.

Referring to FIGS. 6 and 21, the display device 700 may include a functional module 420, a substrate 110, a buffer layer 115, a gate insulating layer 150, a first interlayer insulating layer 190, a second interlayer insulating layer 195, a semiconductor element 250, a connection electrode 235, a planarization layer 270, an insulating layer 275, a light emitting structure 200, a light emitting structure 300 for a module-corresponding area 30, a pixel defining layer 310, a signal wire 610, a thin film encapsulation layer 450, and the like. In this case, the first lower electrode 295 may include a low reflection layer 630, a first metal layer 297, and a second metal layer 298.

As shown in FIGS. 20 and 21, the low reflection layer 630 may include a molybdenum oxide ($MoO_x$) alloy such as molybdenum titanium oxide ($MoTiO_x$), molybdenum tantalum oxide ($MoTaO_x$), and molybdenum copper oxide ($MoCuO_x$). In other words, the low reflection layer 630 may include a metal layer having a property of high light absorptance. In comparison with FIG. 6, even when the high refraction layer 650 is not included, in a case where the low reflection layer 630 includes a metal layer having a high light absorptance, a reflectance by the bottom surface of the second lower electrode 290 may be reduced.

Figure 22:
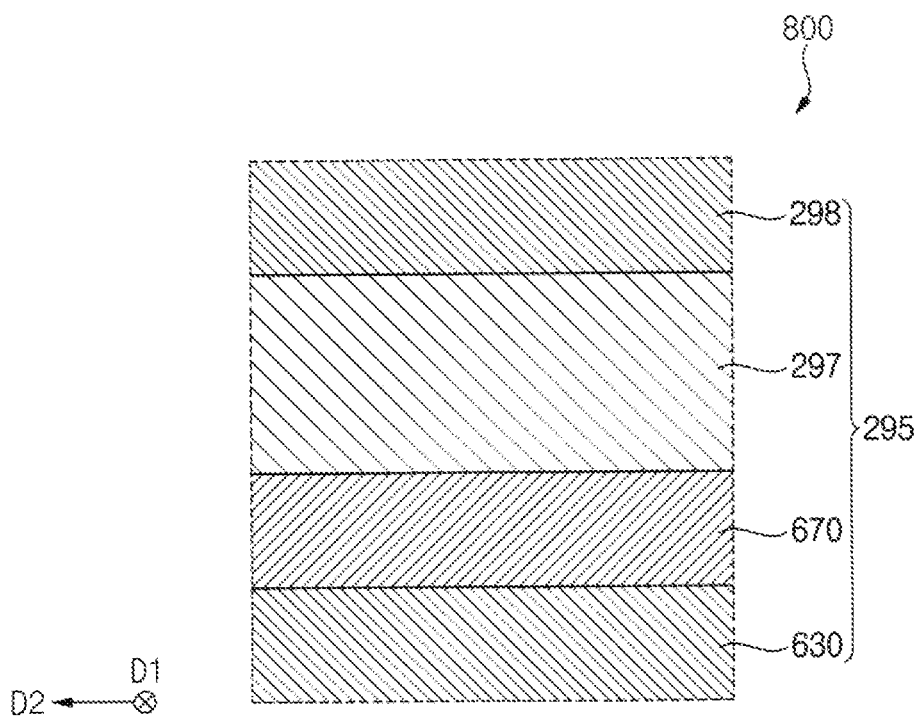
FIG. 22 is a cross-sectional view showing display devices, according to embodiments of the present disclosure.
Figure 23:
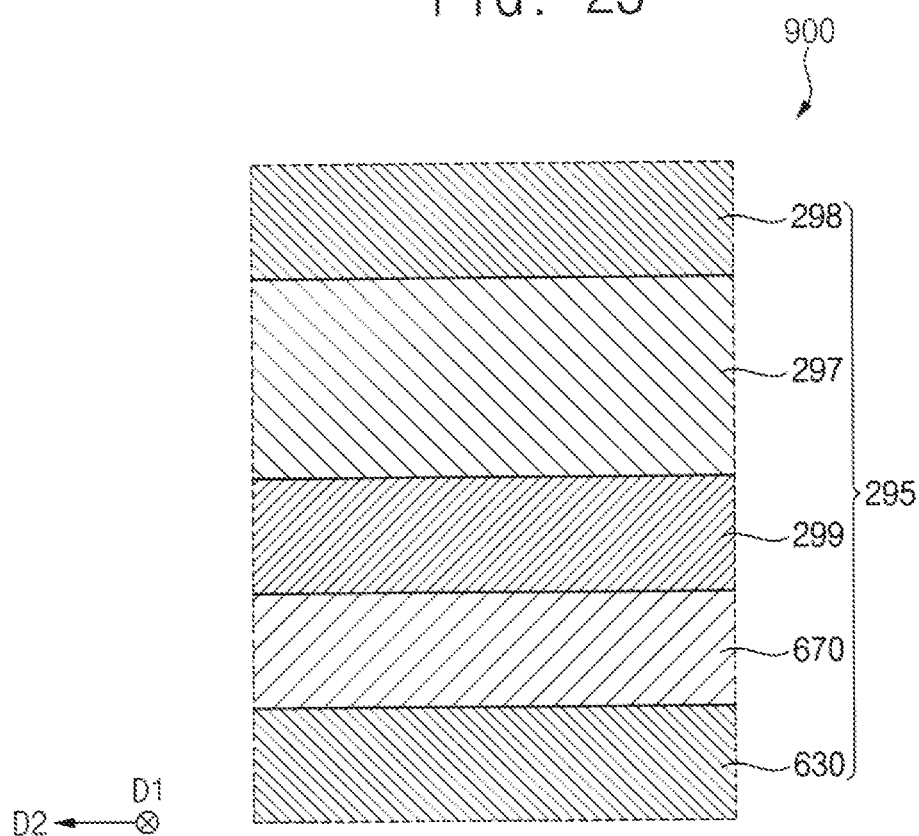
FIG. 23 is a cross-sectional view showing display devices, according to embodiments of the present disclosure.

FIGS. 22 and 23 are cross-sectional views showing display devices according to embodiments of the present disclosure. Each of display devices 800 and 900 illustrated in FIGS. 22 and 23 may have a configuration that is substantially identical or similar to the configuration of the display device 100 described with reference to FIGS. 1 to 7, except for the low reflection layer 630 and the metal layer 670 including a molybdenum alloy. In FIGS. 22 and 23, redundant descriptions of components that are substantially identical or similar to the components described with reference to FIGS. 1 to 7 will be omitted. For example, FIGS. 22 and 23 may correspond to partially enlarged plan views showing the region B of FIG. 6.

Referring to FIGS. 6 and 22, the display device 800 may include a functional module 420, a substrate 110, a buffer layer 115, a gate insulating layer 150, a first interlayer insulating layer 190, a second interlayer insulating layer 195, a semiconductor element 250, a connection electrode 235, a planarization layer 270, an insulating layer 275, a light emitting structure 200, a light emitting structure 300 for a module-corresponding area 30, a pixel defining layer 310, a signal wire 610, a thin film encapsulation layer 450, and the like. In this case, the first lower electrode 295 may include a low reflection layer 630, a metal layer 670, a first metal layer 297, and a second metal layer 298.

Referring to FIGS. 6 and 23, the display device 900 may include a functional module 420, a substrate 110, a buffer layer 115, a gate insulating layer 150, a first interlayer insulating layer 190, a second interlayer insulating layer 195, a semiconductor element 250, a connection electrode 235, a planarization layer 270, an insulating layer 275, a light emitting structure 200, a light emitting structure 300 for a module-corresponding area 30, a pixel defining layer 310, a signal wire 610, a thin film encapsulation layer 450, and the like. In this case, the first lower electrode 295 may include a low reflection layer 630, a metal layer 670, a third metal layer 299, a first metal layer 297, and a second metal layer 298.

As shown in FIGS. 22 and 23, the low reflection layer 630 may include a molybdenum oxide ($MoO_x$) alloy such as molybdenum titanium oxide ($MoTiO_x$), molybdenum tantalum oxide ($MoTaO_x$), and molybdenum copper oxide ($MoCuO_x$). In other words, the low reflection layer 630 may include a metal layer having relatively high light absorptance. In addition, the metal layer 670 may be arranged on the low reflection layer 630, and the metal layer 670 may include molybdenum (Mo), copper (Cu), aluminum (Al), and the like. In comparison with FIG. 6, a metal layer 670 having a high light absorptance may be arranged instead of the high refraction layer 650. In this case, the reflectance of the bottom surface of the second lower electrode 290 may also be reduced.

As described above, the display device 100 including the functional module 420, the substrate 110, the buffer layer 115, the gate insulating layer 150, the first interlayer insulating layer 190, the second interlayer insulating layer 195, the semiconductor element 250, the connection electrode 235, the planarization layer 270, the insulating layer 275, the light emitting structure 200, the light emitting structure 300 for the module-corresponding area 30, the pixel defining layer 310, the signal wire 610, the thin film encapsulation layer 450, and the like may be provided.

Experimental Example: Evaluation of Rear Surface Reflectance of First Lower Electrode According to Thickness of High Refraction Layer The first lower electrode may have a stacked structure of Ti/ITZO (90%)/Ag/ITO. In this case, a thickness of each of high refraction layers A, B, C, and D may be as shown in Table 1. For example, the high refraction layer A may include a material that is ITZO (90%), and may have a thickness of approximately 30 nm. The high refraction layer B may include a material that is ITZO (90%), and may have a thickness of approximately 35 nm. The high refraction layer C may include a material that is ITZO (90%), and may have a thickness of approximately 40 nm. The high refraction layer D may include a material that is ITZO (90%), and may have a thickness of approximately 45 nm.

A reflectance of each of the high refraction layers A, B, C, and D was measured by dividing a light wavelength into 450 nm and 550 nm.

TABLE 1

| Classification | A | B | C | D |
|---|---|---|---|---|
| Material/Thickness | ITZO(90%)/30 nm | ITZO(90%)/35 nm | ITZO(90%)/40 nm | ITZO(90%)/45 nm |
| Average rear surface reflectance | 15.8% | 14.5% | 12.8% | 12.9% |
| Rear surface reflectance at 450 nm | 5.8% | 5.6% | 7.1% | 11.0% |
| Rear surface reflectance at 550 nm | 12.4% | 10.2% | 7.5% | 5.7% |

Some lower electrodes may have a stacked structure of ITO/Ag/ITO, and a reflectance of the lower electrode at a light wavelength of 550 nm was measured to be 104%.

As shown in Table 1, an average rear surface reflectance of the first lower electrode including the high refraction layer A was measured to be 15.8%, an average rear surface reflectance of the first lower electrode including the high refraction layer B was measured to be 14.5%, an average rear surface reflectance of the first lower electrode including the high refraction layer C was measured to be 12.8%, and an average rear surface reflectance of the first lower electrode including the high refraction layer D was measured to be 12.9%. As a result, it was possible to obtain a measurement value that is reduced by about 90% compared to the conventional reflectance.

Experimental Example: Evaluation of Rear Surface Reflectance of First Lower Electrode According to Composition Ratio of ITZO (v5), ITZO (90%), and ITO Composition ratios and refractive indexes of ITZO (v5), ITZO (90%), and ITO may be as shown in Table 2. For example, the ITO may have a composition ratio such as 90 wt % of $In_2O_3$ and 10 wt % of $SnO_2$, and may have an average refractive index of 1.62. The ITZO (v5) may have a composition ratio such as 20 wt % of $In_2O_3$, and may have an average refractive index of 2.19. The ITZO (90%) may have a composition ratio such as 90 wt % of $In_2O_3$, 5 wt % of $SnO_2$, and 5 wt % of ZnO, and may have an average refractive index of 2.19.

TABLE 2

| Classification | Content | Refractive index (Average/450 nm/550 nm) |
|---|---|---|
| ITO | $In_2O_3$ 90 wt %, $SnO_2$ 10 wt % | 1.62/1.65/1.63 |
| ITZO (v5) | $In_2O_3$ 20 wt % | 2.19/2.21/2.13 |
| ITZO (90%) | $In_2O_3$ 90 wt %, $SnO_2$ 5 wt %, ZnO 5 wt % | 2.19/2.21/2.13 |

The first lower electrode may have a stacked structure of Ti/ITZO (v5)/Ag/ITO. In this case, a thickness of each of high refraction layers A, B, C, and D may be as shown in Table 3. For example, the high refraction layer A may include a material that is ITZO (v5), and may have a thickness of approximately 30 nm. The high refraction layer B may include a material that is ITZO (v5), and may have a thickness of approximately 35 nm. The high refraction layer C may include a material that is ITZO (v5), and may have a thickness of approximately 40 nm. The high refraction layer D may include a material that is ITZO (v5), and may have a thickness of approximately 45 nm.

A reflectance of each of the high refraction layers A, B, C, and D was measured by dividing the light wavelength into 450 nm and 550 nm.

TABLE 3

| Classification | A | B | C | D |
|---|---|---|---|---|
| Material/ Thickness | ITZO(v5)/ 30 nm | ITZO(v5)/ 35 nm | ITZO(v5)/ 40 nm | ITZO(v5)/ 45 nm |
| Average rear surface reflectance | 16.5% | 14.3% | 14.4% | 13.3% |
| Rear surface reflectance at 450 nm | 5.0% | 6.8% | 11.9% | 17.8% |
| Rear surface reflectance at 550 nm | 11.7% | 7.6% | 5.7% | 4.4% |

The first lower electrode may have a stacked structure of Ti/ITO/Ag/ITO. In this case, a thickness of each of high refraction layers A, B, and C may be as shown in Table 4. For example, the high refraction layer A may include a material that is ITO, and may have a thickness of approximately 15 nm. The high refraction layer B may include a material that is ITO, and may have a thickness of approximately 30 nm. The high refraction layer C may include a material that is ITO, and may have a thickness of approximately 45 nm.

A reflectance of each of the high refraction layers A, B, and C was measured by dividing the light into separate wavelengths of about 450 nm and about 550 nm.

TABLE 4

| Classification | A | B | C |
|---|---|---|---|
| Material/ Thickness | ITO/ 15 nm | ITO/ 30 nm | ITO/ 45 nm |
| Average rear surface reflectance | 36.2% | 20.7% | 16.9% |
| Rear surface reflectance at 450 nm | 21.0% | 9.0% | 15.1% |
| Rear surface reflectance at 550 nm | 34.4% | 16.9% | 9.0% |

As shown in Tables 1, 3, and 4, the ITZO (90%) and the ITZO (v5) having a relatively high refractive index may have a lower reflectance than the ITO having a relatively low refractive index. As a result, the high refraction layer may preferably include ITZO (90%) and ITZO (v5), each having a higher refractive index than ITO.

Figure 24:
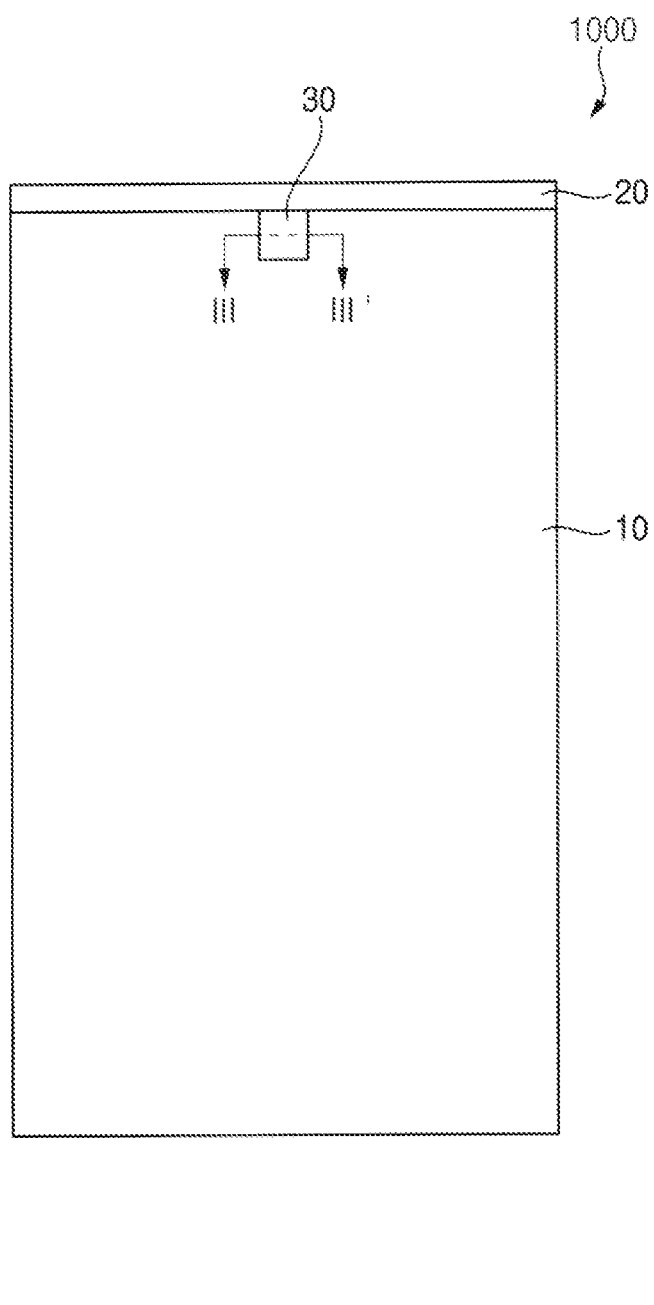
FIG. 24 is a plan view showing a display device, according to embodiments of the present disclosure.
Figure 25:
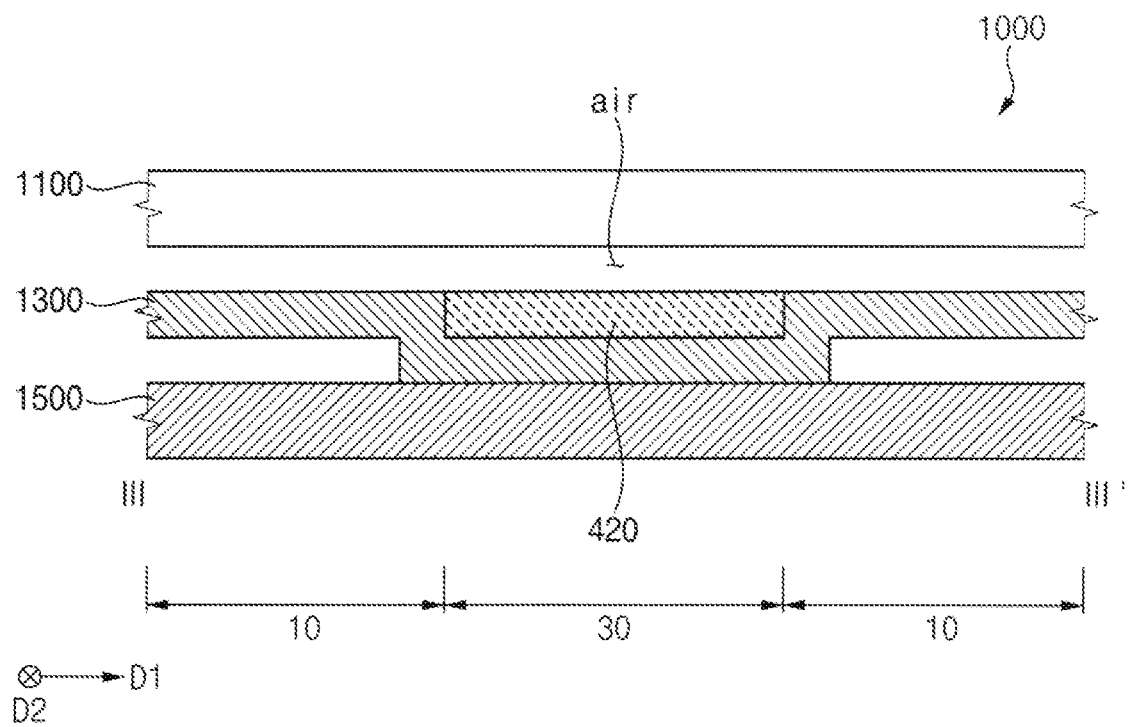
FIG. 25 is a cross-sectional view taken along the line III-III' of FIG. 24.

FIG. 24 is a plan view showing a display device according to embodiments of the present disclosure, and FIG. 25 is a cross-sectional view taken along the line III-III' of FIG. 24. For example, FIG. 24 may correspond to a plan view showing a display area, a module-corresponding area, and a circuit area included in the display device.

Referring to FIGS. 24 and 25, a display device 1000 may include a display panel 1100, a cover member 1500, a frame 1300, a functional module 420, and the like. In this case, the display panel 1100 may include a substrate 110, a buffer layer 115, a gate insulating layer 150, a first interlayer insulating layer 190, a second interlayer insulating layer 195, a semiconductor element 250, a connection electrode 235, a planarization layer 270, an insulating layer 275, a light emitting structure 200, a light emitting structure 300 for a module-corresponding area 30, a pixel defining layer 310, a signal wire 610, a thin film encapsulation layer 450, and the like. In addition, the display panel 1100 may include a display area 10, a module-corresponding area 30, and a pixel circuit area 20 for the module-corresponding area 30.

The functional module 420 may be located in the module-corresponding area 30 on a bottom surface of the display panel 1100. In other words, the functional module 420 may be spaced apart from the display panel 1100, and a layer of air may be interposed between the display panel 1100 and the functional module 420. For example, the bottom surface of the display panel 1100 and a top surface of the functional module 420 may face each other, and an external light passing through the display panel 1100 may be collected through the top surface of the functional module 420. Accordingly, the display device 1000 may acquire an image from the functional module 420.

The frame 1300 surrounding a side surface and a bottom surface of the functional module 420 may be arranged under the display panel 1100 to expose the top surface of the functional module 420. The functional module 420 may be fixed to the frame 1300, and the frame 1300 may be connected to the cover member 1500. In other words, the frame 1300 may serve to support the functional module 420. The frame 1300 may include steel use stainless (SUS), plastic, and the like. In some embodiments, a bottom surface of the frame 1300 may not contact a top surface of the cover member 1500.

The cover member 1500 may be located under the frame 1300. The cover member 1500 may surround the frame 1300 under the display panel 1100, and may extend to a side surface of the display panel 1100. The cover member 1500 may protect the frame 1300, the functional module 420, and the display panel 1100. The cover member 1500 may include SUS, plastic, and the like.

Figure 26:
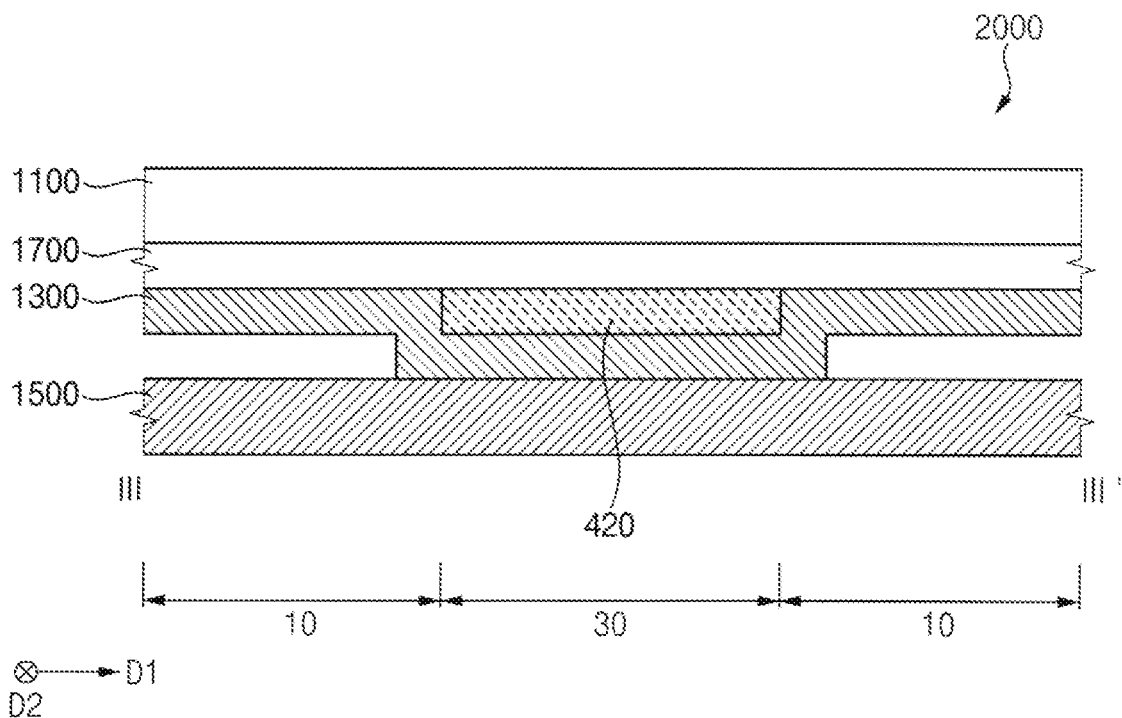
FIG. 26 is a cross-sectional view showing a display device, according to embodiments of the present disclosure.

FIG. 26 is a cross-sectional view showing a display device according to embodiments of the present disclosure. A display device 2000 illustrated in FIG. 26 may have a configuration that is substantially identical or similar to the configuration of the display device 1000 described with reference to FIGS. 24 and 25 except for an adhesive layer 1700. In FIG. 26, redundant descriptions of components that are substantially identical or similar to the components described with reference to FIGS. 24 and 25 will be omitted. For example, FIG. 26 may correspond to a sectional view taken along the line III-III' of FIG. 24.

Referring to FIG. 26, the display device 2000 may include a display panel 1100, a cover member 1500, a frame 1300, a functional module 420, an adhesive layer 1700, and the like.

The adhesive layer 1700 may be on the bottom surface of the display panel 1100. In other words, the adhesive layer 1700 may be interposed between the display panel 1100, and the frame 1300 and the functional module 420. The adhesive layer 1700 may bond the functional module 420 to the bottom surface of the display panel 1100. The adhesive layer 1700 may include, for example, an optical-clear adhesive (OCA), a pressure-sensitive adhesive (PSA), an optical-clear resin (OCR), and the like. In other embodiments, when the functional module 420 is attached to the display panel 1100 through the adhesive layer 1700, the frame 1300 may not be located under the functional module 420.

The embodiments of the present disclosure may be applied to various electronic devices including a display device. For example, the embodiments of the present disclosure may be applied to numerous electronic devices such as vehicle-display devices, ship-display devices, aircraft-display devices, portable communication devices, exhibition display devices, information transfer display devices, medical-display devices, etc.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present disclosure described herein may be implemented utilizing any suitable hardware, firmware (e.g., an application-specific integrated circuit), software, or a combination of software, firmware, and hardware, to process data or digital signals. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Circuit hardware may include, for example, application specific integrated circuits (ASICs), general purpose or special purpose central processing units (CPUs) that is configured to execute instructions stored in a non-transitory storage medium, digital signal processors (DSPs), graphics processing units (GPUs), and programmable logic devices such as field programmable gate arrays (FPGAs).

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Embodiments described herein are examples only. One skilled in the art may recognize various alternative embodiments from those specifically disclosed. Those alternative embodiments are also intended to be within the scope of this disclosure. As such, the embodiments are limited only by the following claims and their equivalents.

What is claimed is:

1. A display device comprising:
    a substrate comprising:
        a module-corresponding area comprising:
            a sub-pixel area for the module-corresponding area; and
            a transparent area;
        a display area surrounding at least a part of the module-corresponding area and comprising:
            a sub-pixel area; and
            a pixel circuit area for the module-corresponding area at one side of the display area;
    a signal wire in the module-corresponding area on the substrate, and extending from the module-corresponding area to the pixel circuit area for the module-corresponding area;
    an insulating layer on the signal wire;
    a lower electrode connected to the signal wire through a contact hole in the insulating layer, the lower electrode comprising:
        a low reflection layer in the sub-pixel area for the module-corresponding area, and on the insulating layer;
        a high refraction layer on the low reflection layer;
        a first metal layer on the high refraction layer; and
        a second metal layer on the first metal layer;
    a light emitting layer on the lower electrode;
    an upper electrode on the light emitting layer; and
    a functional module in the module-corresponding area on a bottom surface of the substrate.

2. The display device of claim 1, further comprising a light emitting structure in the sub-pixel area, and on the substrate.

3. The display device of claim 2, further comprising a pixel circuit structure in the sub-pixel area, and between the substrate and the light emitting structure, the pixel circuit structure comprising a semiconductor element.

4. The display device of claim 3, wherein the pixel circuit structure does not overlap the functional module.

5. The display device of claim 3, further comprising a planarization layer between the semiconductor element in the sub-pixel area and the insulating layer,
    wherein the planarization layer extends from the sub-pixel area to the module-corresponding area.

6. The display device of claim 5, further comprising a connection electrode in the sub-pixel area on the planarization layer,
    wherein the pixel circuit structure is electrically connected to the light emitting structure.

7. The display device of claim 6, wherein the light emitting structure is connected to the connection electrode through a contact hole in the insulating layer, and
wherein the connection electrode is connected to the semiconductor element in the sub-pixel area through a contact hole in the planarization layer.

8. The display device of claim 6, wherein the connection electrode and the signal wire are on a same layer.

9. The display device of claim 6, wherein a thickness of the signal wire is less than a thickness of the connection electrode.

10. The display device of claim 1, wherein the lower electrode, the light emitting layer, and the upper electrode define a light emitting structure for the module-corresponding area.

11. The display device of claim 10, further comprising a pixel circuit structure for the module-corresponding area in the pixel circuit area for the module-corresponding area, and on the substrate, the pixel circuit structure comprising a semiconductor element.

12. The display device of claim 11, wherein the signal wire is configured to electrically connect the light emitting structure for the module-corresponding area to the pixel circuit structure for the module-corresponding area.

13. The display device of claim 11, wherein the pixel circuit structure for the module-corresponding area does not overlap the functional module.

14. The display device of claim 1, wherein the high refraction layer comprises a transparent conductive material.

15. The display device of claim 14, wherein the high refraction layer comprises indium tin zinc oxide (ITZO) or indium zinc oxide (IZO).

16. The display device of claim 14, wherein a thickness of the high refraction layer is less than or equal to about 55 nanometers.

17. The display device of claim 14, wherein a refractive index of the high refraction layer is greater than or equal to about 1.9.

18. The display device of claim 1, wherein the low reflection layer comprises a transparent conductive material.

19. The display device of claim 18, wherein the transparent conductive material comprises at least one selected from molybdenum (Mo), titanium (Ti), zirconium (Zr), hafnium (Hf), vanadium (V), niobium (Nb), tantalum (Ta), chromium (Cr), and tungsten (W).

20. The display device of claim 18, wherein a thickness of the low reflection layer is less than or equal to about 50 nanometers.

21. The display device of claim 1, wherein the signal wire comprises conductive metal oxide and a transparent conductive material.

22. The display device of claim 1, wherein a thickness of the first metal layer is thicker than a thickness of each of the low reflection layer, the high refraction layer, and the second metal layer.

23. The display device of claim 1, wherein the first metal layer comprises silver (Ag), aluminum (Al), gold (Au), copper (Cu), palladium (Pd), platinum (Pt), or rubidium (Rb).

24. The display device of claim 1, wherein the second metal layer comprises indium tin oxide (ITO).

25. The display device of claim 1, further comprising a third metal layer between the first metal layer and the high refraction layer.

26. The display device of claim 25, wherein the third metal layer comprises indium tin oxide (ITO).

27. The display device of claim 1, further comprising:
a gate insulating layer between the substrate and the insulating layer; and
an interlayer insulating layer on the gate insulating layer.

28. The display device of claim 27, wherein the gate insulating layer and the interlayer insulating layer are in the display area and do not overlap the functional module in the module-corresponding area.

29. The display device of claim 1, wherein an outside light incident through the transparent area passes through the substrate and collects at the functional module.

30. A display device comprising:
a display panel comprising:
a substrate comprising:
a module-corresponding area comprising:
a sub-pixel area for the module-corresponding area; and
a transparent area;
a display area surrounding at least a part of the module-corresponding area and comprising:
a sub-pixel area; and
a pixel circuit area for the module-corresponding area at one side of the display area;
a signal wire in the module-corresponding area on the substrate, and extending from the module-corresponding area to the pixel circuit area for the module-corresponding area;
an insulating layer on the signal wire;
a lower electrode connected to the signal wire through a contact hole in the insulating layer, the lower electrode comprising:
a low reflection layer in the sub-pixel area for the module-corresponding area, and on the insulating layer;
a high refraction layer on the low reflection layer;
a first metal layer on the high refraction layer; and
a second metal layer on the first metal layer
a light emitting layer on the lower electrode; and
an upper electrode on the light emitting layer;
a frame on a bottom surface of the display panel; and
a functional module in the module-corresponding area between the display panel and the frame, fixed to the frame, and spaced apart from the bottom surface of the display panel.

31. The display device of claim 30, further comprising an air layer between the display panel and the functional module.

32. The display device of claim 30, further comprising an adhesive layer interposed between the display panel and the functional module.

* * * * *